United States Patent
Kinsley et al.

(10) Patent No.: US 11,960,717 B2
(45) Date of Patent: *Apr. 16, 2024

(54) TECHNIQUES FOR POWER MANAGEMENT USING LOOPBACK

(71) Applicant: Micron Technology, Inc., Boise, ID (US)

(72) Inventors: Thomas H. Kinsley, Boise, ID (US); Matthew A. Prather, Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 17/544,629

(22) Filed: Dec. 7, 2021

(65) Prior Publication Data

US 2022/0171534 A1  Jun. 2, 2022

Related U.S. Application Data

(63) Continuation of application No. 16/290,126, filed on Mar. 1, 2019, now Pat. No. 11,199,967.

(Continued)

(51) Int. Cl.
*G06F 3/06* (2006.01)

(52) U.S. Cl.
CPC ........... *G06F 3/0604* (2013.01); *G06F 3/061* (2013.01); *G06F 3/0625* (2013.01); *G06F 3/0629* (2013.01); *G06F 3/0671* (2013.01)

(58) Field of Classification Search
CPC ...... G06F 3/0604; G06F 3/061; G06F 3/0625; G06F 3/0629; G06F 3/0671;

(Continued)

(56) References Cited

U.S. PATENT DOCUMENTS

2009/0300439 A1  12/2009  Haywood
2009/0316465 A1  12/2009  Jain et al.
(Continued)

FOREIGN PATENT DOCUMENTS

CN  105098406 A  11/2015
CN  106020721 A  10/2016
(Continued)

OTHER PUBLICATIONS

NMOS Pass Transistor, Apr. 5, 2013 (Year: 2013).*

(Continued)

*Primary Examiner* — David Yi
*Assistant Examiner* — Zubair Ahmed
(74) *Attorney, Agent, or Firm* — Holland & Hart LLP

(57) ABSTRACT

Techniques and devices for managing power consumption of a memory system using loopback are described. When a memory system is in a first state (e.g., a deactivated state), a host device may send a signal to change one or more components of the memory system to a second state (e.g., an activated state). The signal may be received by one or more memory devices, which may activate one or more components based on the signal. The one or more memory devices may send a second signal to a power management component, such as a power management integrated circuit (PMIC), using one or more techniques. The second signal may be received by the PMIC using a conductive path running between the memory devices and the PMIC. Based on receiving the second signal or some third signal that is based on the second signal, the PMIC may enter an activated state.

14 Claims, 15 Drawing Sheets

Related U.S. Application Data

(60) Provisional application No. 62/697,882, filed on Jul. 13, 2018.

(58) Field of Classification Search
CPC .... G06F 1/3225; G06F 1/3275; G06F 3/0634; G06F 3/0659; G06F 3/0688; G11C 5/14; Y02D 10/00; Y02D 30/50
USPC .................................................. 711/103, 102
See application file for complete search history.

(56) References Cited

U.S. PATENT DOCUMENTS

| | | | |
|---|---|---|---|
| 2011/0022859 A1 | 1/2011 | More et al. | |
| 2011/0035560 A1* | 2/2011 | Bodrozic | G01R 31/31716 711/155 |
| 2013/0124888 A1 | 5/2013 | Tanaka et al. | |
| 2016/0282414 A1* | 9/2016 | Gielarowski | G01R 31/31723 |
| 2017/0060224 A1 | 3/2017 | Cao et al. | |
| 2017/0277446 A1 | 9/2017 | Cheong | |
| 2017/0285989 A1 | 10/2017 | Lai et al. | |
| 2018/0039324 A1 | 2/2018 | Lee et al. | |
| 2018/0275714 A1* | 9/2018 | Chang | G06F 13/4291 |
| 2019/0340142 A1* | 11/2019 | Patel | G06F 13/24 |

FOREIGN PATENT DOCUMENTS

| | | |
|---|---|---|
| JP | 2003-037532 A | 2/2003 |
| WO | 2005012949 A2 | 2/2005 |

OTHER PUBLICATIONS

ISA/KR, International Search Report of the International Searching Authority, Int'l. Appl. No. PCT/US2019/020529, dated Jun. 19, 2019, Korean Intellectual Property Office, Seo-gu, Daejeon, Republic of Korea, 13pgs.

European Patent Office, "Extended Search Report, " issued in connection with European Patent Application No. 19834333.7, dated Oct. 26, 2021 (8 pages).

European Patent Office, "Office Action," issued in connection with European Patent Application No. 19834333 dated Jun. 29, 2023 (8 pages).

Chinese patent office, "China Office Action," issued in connection with China Patent Application No. 201980052759.5 dated Feb. 1, 2024 (16 pages) (7 pages of English Translation and 9 pages of Original Document).

* cited by examiner

TECHNIQUES FOR POWER MANAGEMENT USING LOOPBACK

CROSS-REFERENCE

The present Application for Patent is a continuation of of U.S. patent application Ser. No. 16/290,126 by Kinsley et al., entitled "Techniques for Power Management Using Loopback," filed Mar. 1, 2019, which claims the benefit of U.S. Provisional Patent Application No. 62/697,882 by Kinsley et al., entitled "Techniques for Power Management Using Loopback," filed Jul. 13, 2018, each of which is assigned to the assignee hereof and each of which is expressly incorporated by reference in its entirety herein.

BACKGROUND

The following relates generally to a system that includes at least one memory device and more specifically to techniques for power management using loopback.

Memory devices are widely used to store information in various electronic devices such as computers, wireless communication devices, cameras, digital displays, and the like. Information is stored by programing different states of a memory device. For example, binary devices most often store one of two states, often denoted by a logic 1 or a logic 0. In other devices, more than two states may be stored. To access the stored information, a component of the device may read, or sense, at least one stored state in the memory device. To store information, a component of the device may write, or program, the state in the memory device.

Various types of memory devices exist, including magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory, e.g., FeRAM, may maintain their stored logic state for extended periods of time even in the absence of an external power source. Volatile memory devices, e.g., DRAM, may lose their stored state over time unless they are periodically refreshed by an external power source.

In some memory systems, a power management integrated circuit (PMIC) may be used to manage power applications of memory devices. The PMIC may be configured to operate in at least one activated state and at least one deactivated state. Techniques for transitioning between states may be desired.

DETAILED DESCRIPTION

Some memory systems may be configured to operate in a deactivated state (e.g., a sleep state) to conserve power. When these memory systems are operating in a deactivated state, components of the memory system may enter deactivated states. For example, a memory device of the memory system may be in a deactivated state and a power management integrated circuit (PMIC) may be in a deactivated state. In some cases, when the PMIC is in a deactivated state, the PMIC and/or other components of a memory system may not be able to receive certain signals. This may be due to certain components being powered down.

Techniques for managing a power consumption of a memory system using loopback are described herein. When a memory system is in a deactivated state, a host device may send a signal to reactivate one or more components of the memory system. The signal may be received by one or more memory devices, which may activate one or more components in response to receiving the signal. The one or more memory devices may send a second signal to the PMIC using one or more loopback pins. The second signal may be received by the PMIC using a conductive path running between the memory devices and the PMIC. Upon receiving the second signal, or some third signal that is based on the second signal, the PMIC may enter an activated state by activating one or more components of the PMIC.

Figure 1:
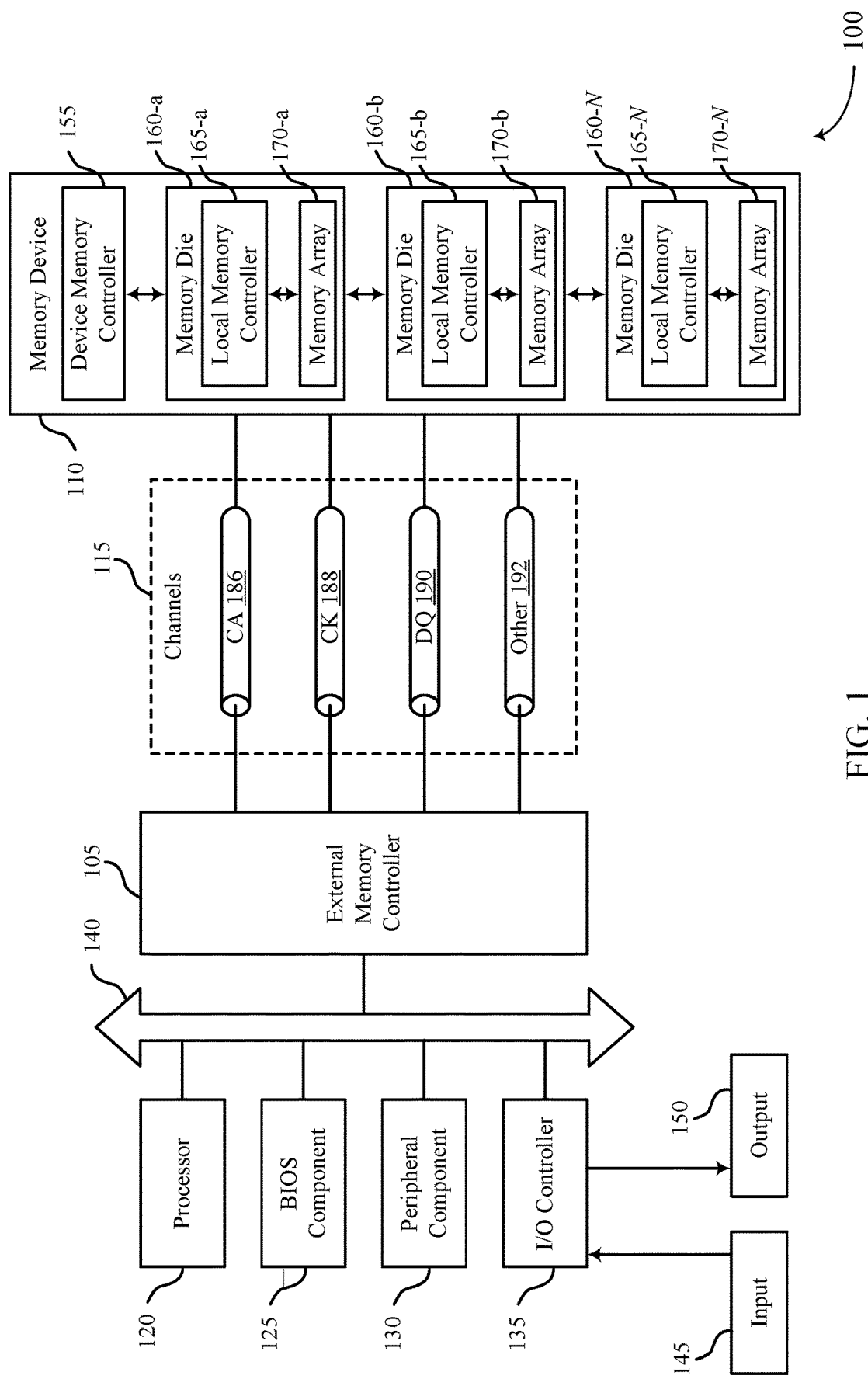
FIG. 1 illustrates an example of a system that supports techniques for power management using loopback as disclosed herein.
Figure 2:
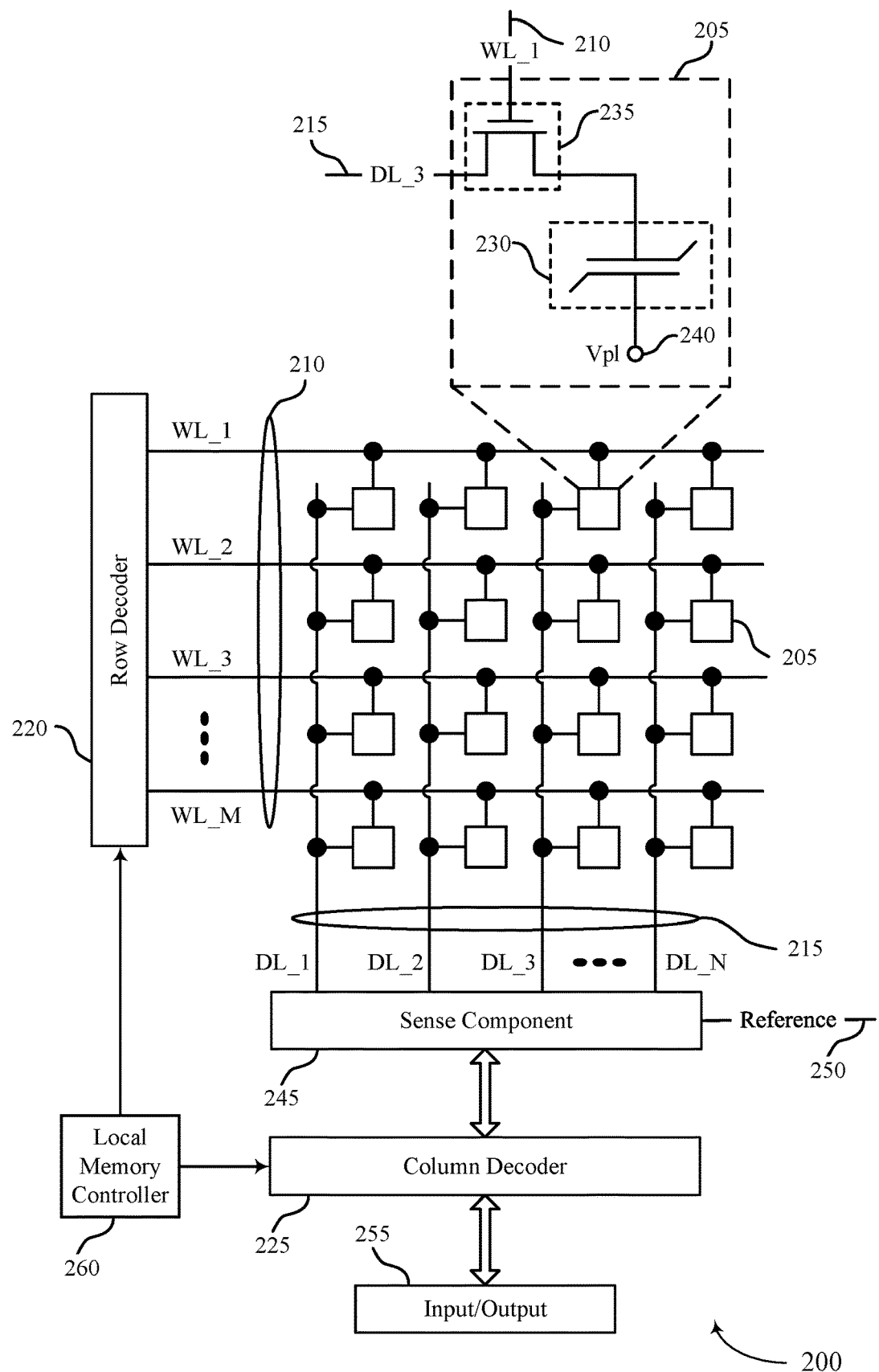
FIG. 2 illustrates an example of a memory die that supports techniques for power management using loopback as disclosed herein.

Features of the disclosure are initially described in the context of a memory system in FIGS. 1 and 2. Features of the disclosure are described in the context memory systems, circuits, and flow diagrams in FIGS. 3 through 6. These and other features of the disclosure are further illustrated by and described with reference to FIGS. 7 through 15 that include apparatus diagrams, system diagrams, and flowcharts that relate to techniques for power management using loopback.

FIG. 1 illustrates an example of a system 100 that utilizes one or more memory devices in accordance with aspects disclosed herein. The system 100 may include an external memory controller 105, a memory device 110, and a plurality of channels 115 coupling the external memory controller 105 with the memory device 110. The system 100 may include one or more memory devices, but for ease of description the one or more memory devices may be described as a single memory device 110.

The system 100 may include aspects of an electronic device, such as a computing device, a mobile computing device, a wireless device, or a graphics processing device. The system 100 may be an example of a portable electronic device. The system 100 may be an example of a computer, a laptop computer, a tablet computer, a smartphone, a cellular phone, a wearable device, an internet-connected device, or the like. The memory device 110 may be component of the system configured to store data for one or more other components of the system 100. In some examples, the system 100 is configured for bi-directional wireless communication with other systems or devices using a base station or access point. In some examples, the system 100 is capable of machine-type communication (MTC), machine-to-machine (M2M) communication, or device-to-device (D2D) communication.

At least portions of the system 100 may be examples of a host device. Such a host device may be an example of a device that uses memory to execute processes such as a computing device, a mobile computing device, a wireless device, a graphics processing device, a computer, a laptop computer, a tablet computer, a smartphone, a cellular phone, a wearable device, an internet-connected device, some other stationary or portable electronic device, or the like. In some cases, the host device may refer to the hardware, firmware, software, or a combination thereof that implements the functions of the external memory controller 105. In some cases, the external memory controller 105 may be referred to as a host or host device. In some examples, system 100 is a graphics card.

In some cases, a memory device 110 may be an independent device or component that is configured to be in communication with other components of the system 100 and provide physical memory addresses/space to potentially be used or referenced by the system 100. In some examples, a memory device 110 may be configurable to work with at least one or a plurality of different types of systems 100. Signaling between the components of the system 100 and the memory device 110 may be operable to support modulation schemes to modulate the signals, different pin designs for communicating the signals, distinct packaging of the system 100 and the memory device 110, clock signaling and synchronization between the system 100 and the memory device 110, timing conventions, and/or other factors.

The memory device 110 may be configured to store data for the components of the system 100. In some cases, the memory device 110 may act as a slave-type device to the system 100 (e.g., responding to and executing commands provided by the system 100 through the external memory controller 105). Such commands may include an access command for an access operation, such as a write command for a write operation, a read command for a read operation, a refresh command for a refresh operation, or other commands. The memory device 110 may include two or more memory dice 160 (e.g., memory chips) to support a desired or specified capacity for data storage. The memory device 110 including two or more memory dice may be referred to as a multi-die memory or package (also referred to as multi-chip memory or package).

The system 100 may further include a processor 120, a basic input/output system (BIOS) component 125, one or more peripheral components 130, and an input/output (I/O) controller 135. The components of system 100 may be in electronic communication with one another using a bus 140.

The processor 120 may be configured to control at least portions of the system 100. The processor 120 may be a general-purpose processor, a digital signal processor (DSP), an application-specific integrated circuit (ASIC), a field-programmable gate array (FPGA) or other programmable logic device, discrete gate or transistor logic, discrete hardware components, or it may be a combination of these types of components. In such cases, the processor 120 may be an example of a central processing unit (CPU), a graphics processing unit (GPU), a general purpose GPU (GPGPU), or a system on a chip (SoC), among other examples.

The BIOS component 125 may be a software component that includes a BIOS operated as firmware, which may initialize and run various hardware components of the system 100. The BIOS component 125 may also manage data flow between the processor 120 and the various components of the system 100, e.g., the peripheral components 130, the I/O controller 135, etc. The BIOS component 125 may include a program or software stored in read-only memory (ROM), flash memory, or any other non-volatile memory.

The peripheral component(s) 130 may be any input device or output device, or an interface for such devices, that may be integrated into or with the system 100. Examples may include disk controllers, sound controller, graphics controller, Ethernet controller, modem, universal serial bus (USB) controller, a serial or parallel port, or peripheral card slots, such as peripheral component interconnect (PCI) or accelerated graphics port (AGP) slots. The peripheral component(s) 130 may be other components understood by those skilled in the art as peripherals.

The I/O controller 135 may manage data communication between the processor 120 and the peripheral component(s) 130, input devices 145, or output devices 150. The I/O controller 135 may manage peripherals that are not integrated into or with the system 100. In some cases, the I/O controller 135 may represent a physical connection or port to external peripheral components.

The input 145 may represent a device or signal external to the system 100 that provides information, signals, or data to the system 100 or its components. This may include a user interface or interface with or between other devices. In some cases, the input 145 may be a peripheral that interfaces with system 100 via one or more peripheral components 130 or may be managed by the I/O controller 135.

The output 150 may represent a device or signal external to the system 100 configured to receive an output from the system 100 or any of its components. Examples of the output 150 may include a display, audio speakers, a printing device, or another processor on printed circuit board, and so forth. In some cases, the output 150 may be a peripheral that interfaces with the system 100 via one or more peripheral components 130 or may be managed by the I/O controller 135.

The components of system 100 may be made up of general-purpose or special purpose circuitry designed to carry out their functions. This may include various circuit elements, for example, conductive lines, transistors, capacitors, inductors, resistors, amplifiers, or other active or passive elements, configured to carry out the functions described herein.

The memory device 110 may include a device memory controller 155 and one or more memory dice 160. Each memory die 160 may include a local memory controller 165 (e.g., local memory controller 165-*a*, local memory controller 165-*b*, and/or local memory controller 165-N) and a memory array 170 (e.g., memory array 170-*a*, memory array 170-*b*, and/or memory array 170-N). A memory array 170 may be a collection (e.g., a grid) of memory cells, with each memory cell being configured to store at least one bit of digital data. Features of memory arrays 170 and/or memory cells are described in more detail with reference to FIG. 2.

The memory device 110 may be an example of a two-dimensional (2D) array of memory cells or may be an example of a three-dimensional (3D) array of memory cells. For example, a 2D memory device may include a single memory die 160. A 3D memory device may include two or more memory dice 160 (e.g., memory die 160-*a*, memory die 160-*b*, and/or any quantity of memory dice 160-N). In a 3D memory device, a plurality of memory dice 160-N may be stacked on top of one another. In some cases, memory dice 160-N in a 3D memory device may be referred to as decks, levels, layers, or dies. A 3D memory device may include any quantity of stacked memory dice 160-N (e.g., two high, three high, four high, five high, six high, seven high, eight high). This may increase the quantity of memory cells that may be positioned on a substrate as compared with a single 2D memory device, which in turn may reduce production costs or increase the performance of the memory array, or both. In some 3D memory device, different decks may share at least one common access line such that some decks may share at least one of a word line, a digit line, and/or a plate line.

The device memory controller 155 may include circuits or components configured to control operation of the memory device 110. As such, the device memory controller 155 may include the hardware, firmware, and software that enables the memory device 110 to perform commands and may be configured to receive, transmit, or execute commands, data, or control information related to the memory device 110. The device memory controller 155 may be configured to communicate with the external memory controller 105, the one or more memory dice 160, or the processor 120. In some cases, the memory device 110 may receive data and/or commands from the external memory controller 105. For example, the memory device 110 may receive a write command indicating that the memory device 110 is to store certain data on behalf of a component of the system 100 (e.g., the processor 120) or a read command indicating that the memory device 110 is to provide certain data stored in a memory die 160 to a component of the system 100 (e.g., the processor 120). In some cases, the device memory controller 155 may control operation of the memory device 110 described herein in conjunction with the local memory controller 165 of the memory die 160. Examples of the components included in the device memory controller 155 and/or the local memory controllers 165 may include receivers for demodulating signals received from the external memory controller 105, decoders for modulating and transmitting signals to the external memory controller 105, logic, decoders, amplifiers, filters, or the like.

The local memory controller 165 (e.g., local to a memory die 160) may be configured to control operations of the memory die 160. Also, the local memory controller 165 may be configured to communicate (e.g., receive and transmit data and/or commands) with the device memory controller 155. The local memory controller 165 may support the device memory controller 155 to control operation of the memory device 110 as described herein. In some cases, the memory device 110 does not include the device memory controller 155, and the local memory controller 165 or the external memory controller 105 may perform the various functions described herein. As such, the local memory controller 165 may be configured to communicate with the device memory controller 155, with other local memory controllers 165, or directly with the external memory controller 105 or the processor 120.

The external memory controller 105 may be configured to enable communication of information, data, and/or commands between components of the system 100 (e.g., the processor 120) and the memory device 110. The external memory controller 105 may act as a liaison between the components of the system 100 and the memory device 110 so that the components of the system 100 may not need to know the details of the memory device's operation. The components of the system 100 may present requests to the external memory controller 105 (e.g., read commands or write commands) that the external memory controller 105 satisfies. The external memory controller 105 may convert or translate communications exchanged between the components of the system 100 and the memory device 110. In some cases, the external memory controller 105 may include a system clock that generates a common (source) system clock signal. In some cases, the external memory controller 105 may include a common data clock that generates a common (source) data clock signal.

In some cases, the external memory controller 105 or other component of the system 100, or its functions described herein, may be implemented by the processor 120. For example, the external memory controller 105 may be hardware, firmware, or software, or some combination thereof implemented by the processor 120 or other component of the system 100. While the external memory controller 105 is depicted as being external to the memory device 110, in some cases, the external memory controller 105, or its functions described herein, may be implemented by a memory device 110. For example, the external memory controller 105 may be hardware, firmware, or software, or some combination thereof implemented by the device memory controller 155 or one or more local memory controllers 165. In some cases, the external memory controller 105 may be distributed across the processor 120 and the memory device 110 such that portions of the external memory controller 105 are implemented by the processor 120 and other portions are implemented by a device memory controller 155 or a local memory controller 165. Likewise, in some cases, one or more functions ascribed herein to the device memory controller 155 or local memory controller 165 may in some cases be performed by the external memory controller 105 (either separate from or as included in the processor 120).

The components of the system 100 may exchange information with the memory device 110 using a plurality of channels 115. In some examples, the channels 115 may enable communications between the external memory controller 105 and the memory device 110. Each channel 115 may include one or more signal paths or transmission mediums (e.g., conductors) between terminals associated with the components of system 100. For example, a channel 115 may include a first terminal including one or more pins or pads at external memory controller 105 and one or more pins or pads at the memory device 110. A pin may be an example of a conductive input or output point of a device of the system 100, and a pin may be configured to act as part of a channel.

In some cases, a pin or pad of a terminal may be part of to a signal path of the channel 115. Additional signal paths may be coupled with a terminal of a channel for routing signals within a component of the system 100. For example, the memory device 110 may include signal paths (e.g., signal paths internal to the memory device 110 or its components, such as internal to a memory die 160) that route a signal from a terminal of a channel 115 to the various components of the memory device 110 (e.g., a device memory controller 155, memory dice 160, local memory controllers 165, memory arrays 170).

Channels 115 (and associated signal paths and terminals) may be dedicated to communicating specific types of information. In some cases, a channel 115 may be an aggregated channel and thus may include multiple individual channels.

For example, a data channel 190 may be x4 (e.g., including four signal paths), x8 (e.g., including eight signal paths), x16 (including sixteen signal paths), and so forth.

In some cases, the channels 115 may include one or more command and address (CA) channels 186. The CA channels 186 may be configured to communicate commands between the external memory controller 105 and the memory device 110 including control information associated with the commands (e.g., address information). For example, the CA channel 186 may include a read command with an address of the desired data. In some cases, the CA channels 186 may be registered on a rising clock signal edge and/or a falling clock signal edge. In some cases, a CA channel 186 may include eight or nine signal paths.

In some cases, the channels 115 may include one or more clock signal (CK) channels 188. The CK channels 188 may be configured to communicate one or more common clock signals between the external memory controller 105 and the memory device 110. Each clock signal may be configured to oscillate between a high state and a low state and coordinate the actions of the external memory controller 105 and the memory device 110. In some cases, the clock signal may be a differential output (e.g., a CK_t signal and a CK_c signal) and the signal paths of the CK channels 188 may be configured accordingly. In some cases, the clock signal may be single ended. A CK channel 188 may include any quantity of signal paths. In some cases, the clock signal CK (e.g., a CK_t signal and a CK_c signal) may provide a timing reference for command and addressing operations for the memory device 110, or other system-wide operations for the memory device 110. The clock signal CK therefore may be variously referred to as a control clock signal CK, a command clock signal CK, or a system clock signal CK. The system clock signal CK may be generated by a system clock, which may include one or more hardware components (e.g., oscillators, crystals, logic gates, transistors, or the like).

In some cases, the channels 115 may include one or more data (DQ) channels 190. The data channels 190 may be configured to communicate data and/or control information between the external memory controller 105 and the memory device 110. For example, the data channels 190 may communicate information (e.g., bi-directional) to be written to the memory device 110 or information read from the memory device 110. The data channels 190 may communicate signals that may be modulated using different modulation schemes (e.g., NRZ, PAM4).

In some cases, the channels 115 may include one or more other channels 192 that may be dedicated to other purposes. These other channels 192 may include any number of signal paths.

In some cases, the other channels 192 may include one or more write clock signal (WCK) channels. While the 'W' in WCK may nominally stand for "write," a write clock signal WCK (e.g., a WCK_t signal and a WCK_c signal) may provide a timing reference for access operations generally for the memory device 110 (e.g., a timing reference for both read and write operations). Accordingly, the write clock signal WCK may also be referred to as a data clock signal WCK. The WCK channels may be configured to communicate a common data clock signal between the external memory controller 105 and the memory device 110. The data clock signal may be configured to coordinate an access operation (e.g., a write operation or read operation) of the external memory controller 105 and the memory device 110. In some cases, the write clock signal may be a differential output (e.g., a WCK_t signal and a WCK_c signal) and the signal paths of the WCK channels may be configured accordingly. A WCK channel may include any quantity of signal paths. The data clock signal WCK may be generated by a data clock, which may include one or more hardware components (e.g., oscillators, crystals, logic gates, transistors, or the like).

In some cases, the other channels 192 may include one or more error detection code (EDC) channels. The EDC channels may be configured to communicate error detection signals, such as checksums, to improve system reliability. An EDC channel may include any quantity of signal paths.

The channels 115 may couple the external memory controller 105 with the memory device 110 using different architectures. Examples of the various architectures may include a bus, a point-to-point connection, a crossbar, a high-density interposer such as a silicon interposer, or channels formed in an organic substrate or some combination thereof. For example, in some cases, the signal paths may at least partially include a high-density interposer, such as a silicon interposer or a glass interposer.

Signals communicated over the channels 115 may be modulated using a variety of different modulation schemes. In some cases, a binary-symbol (or binary-level) modulation scheme may be used to modulate signals communicated between the external memory controller 105 and the memory device 110. A binary-symbol modulation scheme may be an example of a M-ary modulation scheme where M is equal to two. Each symbol of a binary-symbol modulation scheme may be configured to represent one bit of digital data (e.g., a symbol may represent a logic 1 or a logic 0). Examples of binary-symbol modulation schemes include, but are not limited to, non-return-to-zero (NRZ), unipolar encoding, bipolar encoding, Manchester encoding, pulse amplitude modulation (PAM) having two symbols (e.g., PAM2), and/or others.

In some cases, a multi-symbol (or multi-level) modulation scheme may be used to modulate signals communicated between the external memory controller 105 and the memory device 110. A multi-symbol modulation scheme may be an example of a M-ary modulation scheme where M is greater than or equal to three. Each symbol of a multi-symbol modulation scheme may be configured to represent more than one bit of digital data (e.g., a symbol may represent a logic 00, a logic 01, a logic 10, or a logic 11). Examples of multi-symbol modulation schemes include, but are not limited to, PAM4, PAM8, etc., quadrature amplitude modulation (QAM), quadrature phase shift keying (QPSK), and/or others. A multi-symbol signal or a PAM4 signal may be a signal that is modulated using a modulation scheme that includes at least three levels to encode more than one bit of information. Multi-symbol modulation schemes and symbols may alternatively be referred to as non-binary, multi-bit, or higher-order modulation schemes and symbols.

In some cases, the memory device 110 may be configured to send an activation signal to a PMIC using one or more loopback pins of the memory device 110. The loop back pins may be coupled with the PMIC using a conductive path. In some cases, the conductive path may be gated with a transistor. In some cases, the conductive path may be inductively coupled with a second conductive path.

FIG. 2 illustrates an example of a memory die 200 in accordance with various examples of the present disclosure. The memory die 200 may be an example of the memory dice 160 described with reference to FIG. 1. In some cases, the memory die 200 may be referred to as a memory chip, a memory device, or an electronic memory apparatus. The memory die 200 may include one or more memory cells 205 that are programmable to store different logic states. Each memory cell 205 may be programmable to store two or more states. For example, the memory cell 205 may be configured to store one bit of digital logic at a time (e.g., a logic 0 and a logic 1). In some cases, a single memory cell 205 (e.g., a multi-level memory cell) may be configured to store more than one bit of digit logic at a time (e.g., a logic 00, logic 01, logic 10, or a logic 11).

A memory cell 205 may store a charge representative of the programmable states in a capacitor. DRAM architectures may include a capacitor that includes a dielectric material to store a charge representative of the programmable state. In other memory architectures, other storage devices and components are possible. For example, nonlinear dielectric materials may be employed.

Operations such as reading and writing may be performed on memory cells 205 by activating or selecting access lines such as a word line 210 and/or a digit line 215. In some cases, digit lines 215 may also be referred to as bit lines. References to access lines, word lines and digit lines, or their analogues, are interchangeable without loss of understanding or operation. Activating or selecting a word line 210 or a digit line 215 may include applying a voltage to the respective line.

The memory die 200 may include the access lines (e.g., the word lines 210 and the digit lines 215) arranged in a grid-like pattern. Memory cells 205 may be positioned at intersections of the word lines 210 and the digit lines 215. By biasing a word line 210 and a digit line 215 (e.g., applying a voltage to the word line 210 or the digit line 215), a single memory cell 205 may be accessed at their intersection.

Accessing the memory cells 205 may be controlled through a row decoder 220 or a column decoder 225. For example, a row decoder 220 may receive a row address from the local memory controller 260 and activate a word line 210 based on the received row address. A column decoder 225 may receive a column address from the local memory controller 260 and may activate a digit line 215 based on the received column address. For example, the memory die 200 may include multiple word lines 210, labeled WL_1 through WL_M, and multiple digit lines 215, labeled DL_1 through DL_N, where M and N depend on the size of the memory array. Thus, by activating a word line 210 and a digit line 215, e.g., WL_1 and DL_3, the memory cell 205 at their intersection may be accessed. The intersection of a word line 210 and a digit line 215, in either a two-dimensional or three-dimensional configuration, may be referred to as an address of a memory cell 205.

The memory cell 205 may include a logic storage component, such as capacitor 230 and a switching component 235. The capacitor 230 may be an example of a dielectric capacitor or a ferroelectric capacitor. A first node of the capacitor 230 may be coupled with the switching component 235 and a second node of the capacitor 230 may be coupled with a voltage source 240. In some cases, the voltage source 240 may be the cell plate reference voltage, such as Vpl, or may be ground, such as Vss. In some cases, the voltage source 240 may be an example of a plate line coupled with a plate line driver. The switching component 235 may be an example of a transistor or any other type of switch device that selectively establishes or de-establishes electronic communication between two components.

Selecting or deselecting the memory cell 205 may be accomplished by activating or deactivating the switching component 235. The capacitor 230 may be in electronic communication with the digit line 215 using the switching component 235. For example, the capacitor 230 may be isolated from digit line 215 when the switching component 235 is deactivated, and the capacitor 230 may be coupled with digit line 215 when the switching component 235 is activated. In some cases, the switching component 235 is a transistor and its operation may be controlled by applying a voltage to the transistor gate, where the voltage differential between the transistor gate and transistor source may be greater or less than a threshold voltage of the transistor. In some cases, the switching component 235 may be a p-type transistor or an n-type transistor. The word line 210 may be in electronic communication with the gate of the switching component 235 and may activate/deactivate the switching component 235 based on a voltage being applied to word line 210.

A word line 210 may be a conductive line in electronic communication with a memory cell 205 that is used to perform access operations on the memory cell 205. In some architectures, the word line 210 may be in electronic communication with a gate of a switching component 235 of a memory cell 205 and may be configured to control the switching component 235 of the memory cell. In some architectures, the word line 210 may be in electronic communication with a node of the capacitor of the memory cell 205 and the memory cell 205 may not include a switching component.

A digit line 215 may be a conductive line that connects the memory cell 205 with a sense component 245. In some architectures, the memory cell 205 may be selectively coupled with the digit line 215 during portions of an access operation. For example, the word line 210 and the switching component 235 of the memory cell 205 may be configured to couple and/or isolate the capacitor 230 of the memory cell 205 and the digit line 215. In some architectures, the memory cell 205 may be in electronic communication (e.g., constant) with the digit line 215.

The sense component 245 may be configured to detect a state (e.g., a charge) stored on the capacitor 230 of the memory cell 205 and determine a logic state of the memory cell 205 based on the stored state. The charge stored by a memory cell 205 may be extremely small, in some cases. As such, the sense component 245 may include one or more sense amplifiers to amplify the signal output by the memory cell 205. The sense amplifiers may detect small changes in the charge of a digit line 215 during a read operation and may produce signals corresponding to a logic state 0 or a logic state 1 based on the detected charge. During a read operation, the capacitor 230 of memory cell 205 may output a signal (e.g., discharge a charge) to its corresponding digit line 215. The signal may cause a voltage of the digit line 215 to change. The sense component 245 may be configured to compare the signal received from the memory cell 205 across the digit line 215 to a reference signal 250 (e.g., reference voltage). The sense component 245 may determine the stored state of the memory cell 205 based on the comparison. For example, in binary-signaling, if digit line 215 has a higher voltage than the reference signal 250, the sense component 245 may determine that the stored state of memory cell 205 is a logic 1 and, if the digit line 215 has a lower voltage than the reference signal 250, the sense component 245 may determine that the stored state of the memory cell 205 is a logic 0. The sense component 245 may include various transistors or amplifiers to detect and amplify a difference in the signals. The detected logic state of memory cell 205 may be output through column decoder 225 as output 255. In some cases, the sense component 245 may be part of another component (e.g., a column decoder 225, row decoder 220). In some cases, the sense component 245 may be in electronic communication with the row decoder 220 or the column decoder 225.

The local memory controller 260 may control the operation of memory cells 205 through the various components (e.g., row decoder 220, column decoder 225, and sense component 245). The local memory controller 260 may be an example of the local memory controller 165 described with reference to FIG. 1. In some cases, one or more of the row decoder 220, column decoder 225, and sense component 245 may be co-located with the local memory controller 260. The local memory controller 260 may be configured to receive commands and/or data from an external memory controller 105 (or a device memory controller 155 described with reference to FIG. 1), translate the commands and/or data into information that can be used by the memory die 200, perform one or more operations on the memory die 200, and communicate data from the memory die 200 to the external memory controller 105 (or the device memory controller 155) in response to performing the one or more operations. The local memory controller 260 may generate row and column address signals to activate the target word line 210 and the target digit line 215. The local memory controller 260 may also generate and control various voltages or currents used during the operation of the memory die 200. In general, the amplitude, shape, or duration of an applied voltage or current discussed herein may be adjusted or varied and may be different for the various operations discussed in operating the memory die 200.

In some cases, the memory die 200 may be configured to send an activation signal to a PMIC using one or more loopback pins of the memory die 200. The loop back pins may be coupled with the PMIC using a conductive path. In some cases, the conductive path may be gated with a transistor. In some cases, the conductive path may be inductively coupled with a second conductive path.

In some cases, the local memory controller 260 may be configured to perform a write operation (e.g., a programming operation) on one or more memory cells 205 of the memory die 200. During a write operation, a memory cell 205 of the memory die 200 may be programmed to store a desired logic state. In some cases, a plurality of memory cells 205 may be programmed during a single write operation. The local memory controller 260 may identify a target memory cell 205 on which to perform the write operation. The local memory controller 260 may identify a target word line 210 and a target digit line 215 in electronic communication with the target memory cell 205 (e.g., the address of the target memory cell 205). The local memory controller 260 may activate the target word line 210 and the target digit line 215 (e.g., applying a voltage to the word line 210 or digit line 215), to access the target memory cell 205. The local memory controller 260 may apply a specific signal (e.g., voltage) to the digit line 215 during the write operation to store a specific state (e.g., charge) in the capacitor 230 of the memory cell 205, the specific state (e.g., charge) may be indicative of a desired logic state.

In some cases, the local memory controller 260 may be configured to perform a read operation (e.g., a sense operation) on one or more memory cells 205 of the memory die 200. During a read operation, the logic state stored in a memory cell 205 of the memory die 200 may be determined. In some cases, a plurality of memory cells 205 may be sensed during a single read operation. The local memory controller 260 may identify a target memory cell 205 on which to perform the read operation. The local memory controller 260 may identify a target word line 210 and a target digit line 215 in electronic communication with the target memory cell 205 (e.g., the address of the target memory cell 205). The local memory controller 260 may activate the target word line 210 and the target digit line 215 (e.g., applying a voltage to the word line 210 or digit line 215), to access the target memory cell 205. The target memory cell 205 may transfer a signal to the sense component 245 in response to biasing the access lines. The sense component 245 may amplify the signal. The local memory controller 260 may fire the sense component 245 (e.g., latch the sense component) and thereby compare the signal received from the memory cell 205 to the reference signal 250. Based on that comparison, the sense component 245 may determine a logic state that is stored on the memory cell 205. The local memory controller 260 may communicate the logic state stored on the memory cell 205 to the external memory controller 105 (or the device memory controller 155) as part of the read operation.

Figure 3:
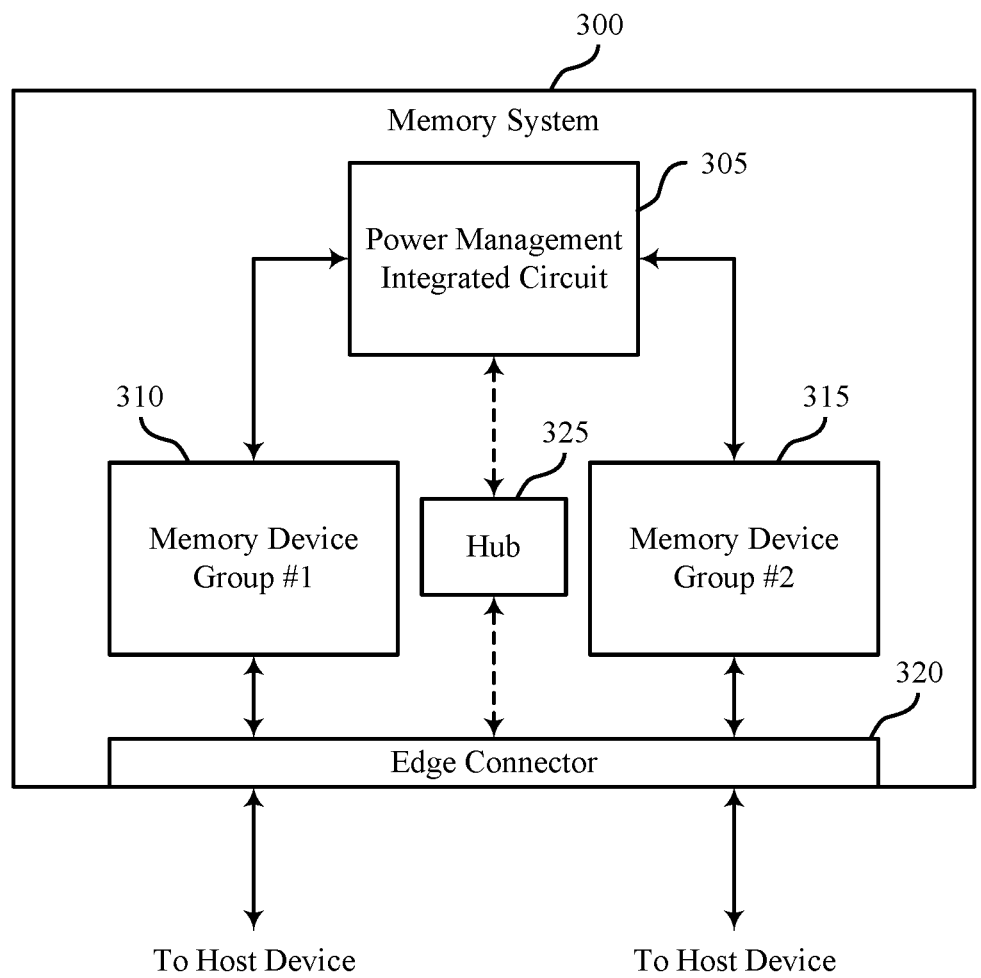
FIG. 3 illustrates an example of a memory system that supports techniques for power management using loopback as disclosed herein.

FIG. 3 illustrates an example of a memory system 300 that supports techniques for power management using loopback. The memory system 300 may include a power management integrated circuit 305, a first group of memory devices 310, and a second group of memory devices 315. The memory system 300 may also include an edge connector 320 and a hub 325.

In some computing devices, memory may be packaged into memory components or modules such as a single in-line memory module (SIMM), a dual in-line memory module (DIMM), or as small outline dual in-line memory module (SO-DIMM). The memory system 300 may be an example of one of these memory components or modules. The memory system 300 may include one or more memory devices (e.g., memory device 160) arranged in a variety of configurations (e.g., a quantity of different groups of memory devices 310, 315). In some examples, the memory system 300 may configured into a package that can be integrated into a larger device using one or more ports or connectors.

The PMIC 305 of the memory system 300 may be for managing power constraints of the various components of the memory system 300 including the memory devices and/or the groups of memory devices 310, 315. The PMIC 305 may perform one or more of the following functions: current conversion, power-source selection, voltage scaling, power sequencing, or deactivated state power control, or any combination thereof. In some cases, the PMIC 305 may enter a deactivated state where one or more components of the PMIC 305 are deactivated so that the memory system 300 or the larger host device can conserve power.

The memory system 300 may include memory devices configured in different configurations. For example, the memory system 300 may include a first group of memory devices 310 and a second group of memory devices 315. A group of memory devices may include one or more memory devices, where each group of memory devices may communicate with a host device using a data channel, which may be an independent data channel. In some examples, the memory system 300 may include memory devices organized into a single group or the memory system 300 may include two or more than two groups of memory device (e.g., three groups, four groups, five groups).

The memory system 300 may include an edge connector 320 for interfacing with a host device. The edge connector 320 may include a plurality of pins for exchanging messages between the memory module and the host device. The edge connector 320 may be configured according to a single data rate (SDR) interface, a double data rate (DDR) interface (e.g., DDR1, DDR2, DDR3, DDR4, DDR5), or a graphics double data rate (GDDR) interface (e.g., GDDR1, GDDR2, GDDR3, GDDR4, GDDR5, GDDR6, GDDR6x, GDDR7/Next).

The hub 325 may be configured route one or more messages within the memory system 300. In the memory system 300, not every individual component of the memory system 300 may have a dedicated connection (e.g., a dedicated pin) with the host device via the edge connector 320. The hub 325 may be configured to receive one or more messages from the host device (via the edge connector 320) for a plurality of different components and then route those messages to the proper components. This may allow for the host device to control the plurality of components without adding to the quantity of pins in the edge connector 320. In some cases, the hub 325 may be configured to route messages between components of the memory system internally (e.g., without interfacing with the host device).

Some host devices may operate using different states to conserve power. For example, mobile devices such as smartphones, tablets, or laptops may enter sleep states, low-power states, or deactivated states to conserve power. Power conservation in these devices may be desirable because the devices may be battery operated. As part of entering a deactivated state, the memory system 300 may also enter a deactivated state where one or more components of the memory system 300 may be deactivated or may be in a low-power state.

In some cases, the PMIC 305 may deactivate one or more components of the memory devices and/or one or more components of the PMIC 305 itself when entering a deactivated state. Upon entering a deactivated state, these components may be configured to be activated or reactivated (e.g., upon receiving a message from the host device).

In some cases, deactivating some components of the PMIC 305 may disrupt communication between certain components of the memory system 300. For example, if the PMIC 305 deactivates certain voltage rails or voltage sources, some components may not be capable of communicating with the hub 325, the edge connector 320, other components, or any combination thereof. One such example, may be the PMIC 305 itself. As such, techniques for activating (or reactivating) the PMIC 305 that is in a deactivated state may be desirable.

Techniques for managing a power consumption of a memory system 300 using loopback are described herein. When a memory system 300 is in a deactivated state, a host device may send a signal to activate or reactivate one or more components of the memory system 300. The signal may be received by one or more groups of memory devices 310, 315, which may activate one or more components in response to receiving the signal. The one or more groups of memory devices 310, 315 may send a second signal to the PMIC 305 using one or more loop back pins, which signal may be for activating or reactivating one or more components of the PMIC 305. The second signal may, in some examples, be received by the PMIC 305 (e.g., using one or more direct connections between the group of memory devices 310, 315 and the PMIC 305). The second signal may, in some examples, be received by the PMIC 305 (e.g., using one or more inductive connections between the group of memory devices 310, 315 and the PMIC 305). Upon receiving the second signal or some third signal that is based on the second signal, the PMIC 305 may enter an activated state by activating one or more components of the PMIC 305.

Figure 4:
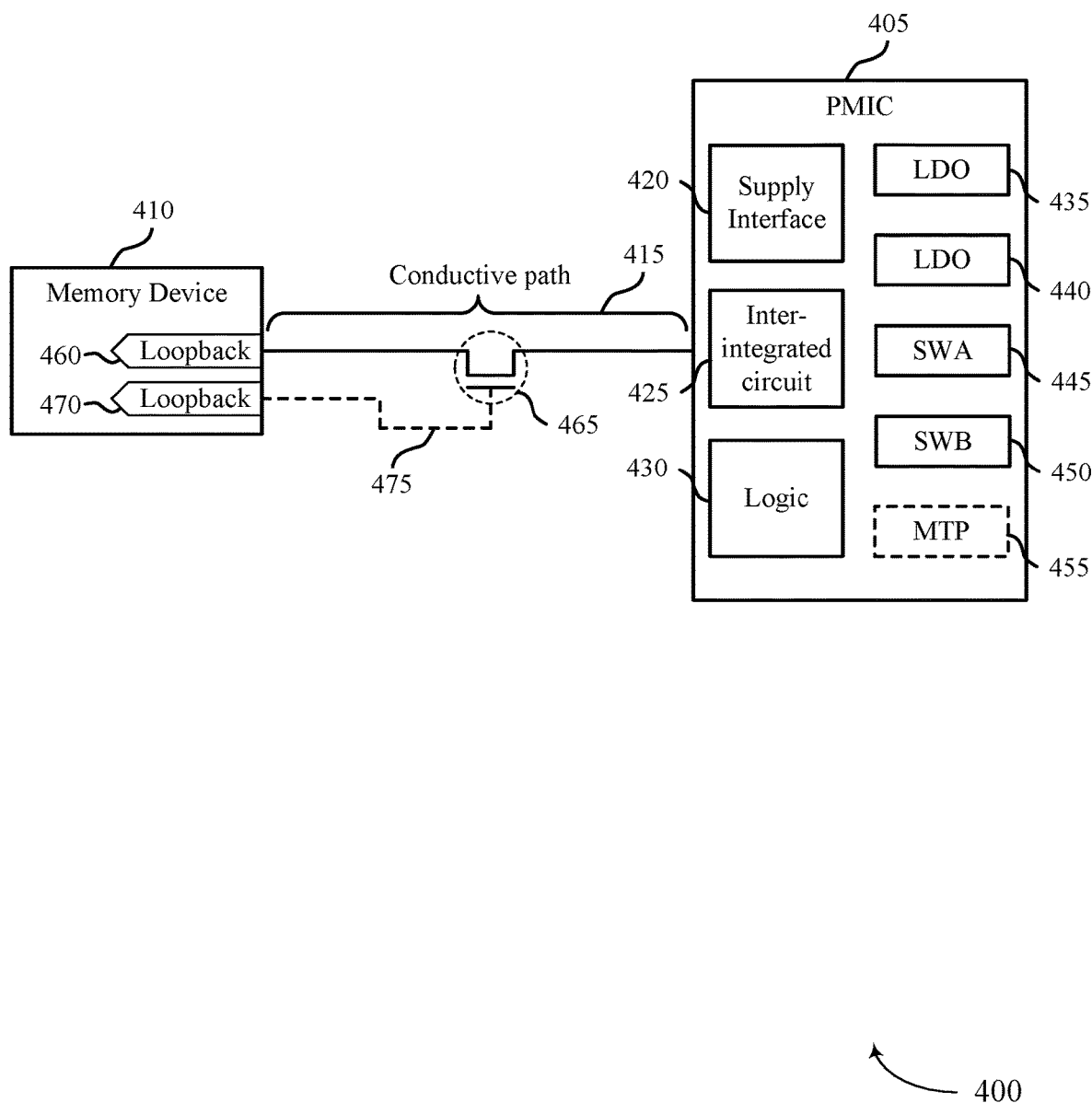
FIG. 4 illustrates an example of a circuit of a memory system that supports techniques for power management using loopback as disclosed herein.

FIG. 4 illustrates an example of a circuit 400 of a memory system that supports techniques for power management using loopback. The circuit 400 may be an example of one or more components of the memory system 300 described with reference to FIG. 3. The circuit 400 may include a PMIC 405, a memory device 410, and a conductive path 415 between the PMIC 405 and the memory device 410. In the example of the circuit 400, the conductive path 415 may be an example of a conductive line that directly couples the PMIC 405 with the memory device 410. The PMIC 405 may be an example of the PMIC 305 described with reference to FIG. 3. The memory device 410 may be an example of a memory device 160 or a group of memory devices 310, 315 described with reference to FIGS. 1 through 3.

The PMIC 405 may include a supply interface 420, an inter-integrated circuit 425, logic 430, low-dropout regulators 435, 440, power supplies 445, 450, and, in some cases, multi-time programmable memory 455. The supply interface 420 may be configured to receive power to activate the PMIC 405 and be distributed to other components of a memory system through the PMIC 405. The inter-integrated circuit 425 may be an example of a bus configured to couple the PMIC 405 with other components. In some cases, the inter-integrated circuit 425 may include a pin configured for receiving a serial clock from another component. The logic 430 may include an analog-to-digital converter, a digital-to-analog converter, an oscillator, or other components, or a combination thereof. Logic 430 may, in some examples, be for providing feedback to other components in a memory system.

The low-dropout regulators 435, 440 may be for outputting power (e.g., DC power) to the memory devices of the memory system, including the memory device 410. In some cases, the low-dropout regulators 435, 440 may be used to regulate an output voltage, when the output voltage is close to a supply voltage input to the PMIC 405. The power supplies 445, 450 may be for outputting power to the memory devices of the memory system, including the memory device 410. In some cases, the power supplies 445, 450 may be examples of switching regulators. The PMIC 405 may include any quantity of low-dropout regulators (e.g., one, two, three, four, five, six, seven, eight), or may include any quantity of power supplies (e.g., one, two, three, four, five, six, seven, eight), or any quantity of both.

The multi-time programmable memory 455, which may optionally be included in a PMIC 405, may be any type of memory used by the PMIC 405 for performing the functions described herein. In some cases, the multi-time programmable memory 455 may be an example of an electrically erasable programmable read-only memory (EEPROM) or other type of memory technology. The multi-time programmable memory 455 may be for protecting circuits, improving a reliability of a power-on sequence or a power-off sequence, setting of output voltage(s), setting of output pull-down resistance(s), or other functions, or any combination thereof.

The memory device 410 may include at least one loopback pin 460. The conductive path 415 may couple the loopback pin 460 of the memory device 410 with the PMIC 405. In some cases, the conductive path 415 may couple with a serial clock pin of the inter-integrated circuit 425 of the PMIC 405. The conductive path 415 may include any set of one or more lines that establish a communicative link between the memory device 410 and the PMIC 405. The conductive path 415 may directly couple the memory device 410 and the PMIC 405, meaning that the conductive path 415 may establish a connection between the two components that allows a signal to be routed directly between the components.

Some memory devices may include loopback pins for use during testing, manufacturing, and/or operation of the memory device. For example, during a testing phase of a memory device, a plurality of read commands, or write commands, or both may be applied to the memory device. The loopback pins may be used to transmit feedback data directly to the test bench. Such a direct feedback loop may increase the speed of testing. After the memory device has been tested, the loopback pins may not be used for communication with a host device in certain applications. In some cases, edge connectors built to a specification, such as DDR specification, may not use loopback pins. In such cases, the loopback pins of some memory devices may be unused or unconnected with other components.

Techniques are provided herein for using at least one loopback pin of the memory device to drive a signal to the PMIC 405 that is used to activate at least a portion of the PMIC 405. The signal may be an example of an activation signal. The memory device 410 may transmit the signal using a loopback pin because, when the PMIC 405 is in a first state (e.g., a deactivated state), the PMIC 405 may not be able to receive certain types of communications.

In some examples, the conductive path 415 may be a direct communication path between the memory device 410 and the PMIC 405. In such examples, a signal transmitted by the loopback pin 460 may be carried by one or more conductive lines and through one or more devices (e.g., transistors or other components) to the PMIC 405.

In other examples, the conductive path 415 may be a gated conductive path that includes a transistor 465 controlled by a loopback pin, such as a second loopback pin 470, of the memory device 410. In such examples, the transistor 465 may be positioned along the conductive path 415 between the memory device 410 and the PMIC 405. A second conductive path 475 may couple the second loopback pin 470 with a gate of the transistor 465. The memory device 410 may be configured to send the signal (e.g., the activation signal) to the PMIC 405 based on transmitting the signal using the first loopback pin 460 and activating the transistor 465 using the second loopback pin 470.

In some cases, the memory device 410 may transmit the activation signal using any pin of the memory device 410. In such cases, the loopback pin 460 may be an example of a pin that the memory device 410 may use, in some examples, and should not be considered limiting. In some cases, the memory device 410 may transmit the gate signal to the transistor 465 using any pin of the memory device. In such cases, the second loopback pin 470 is an example of a pin that the memory device 410 may use, in some examples, and should not be considered limiting.

Figure 5:
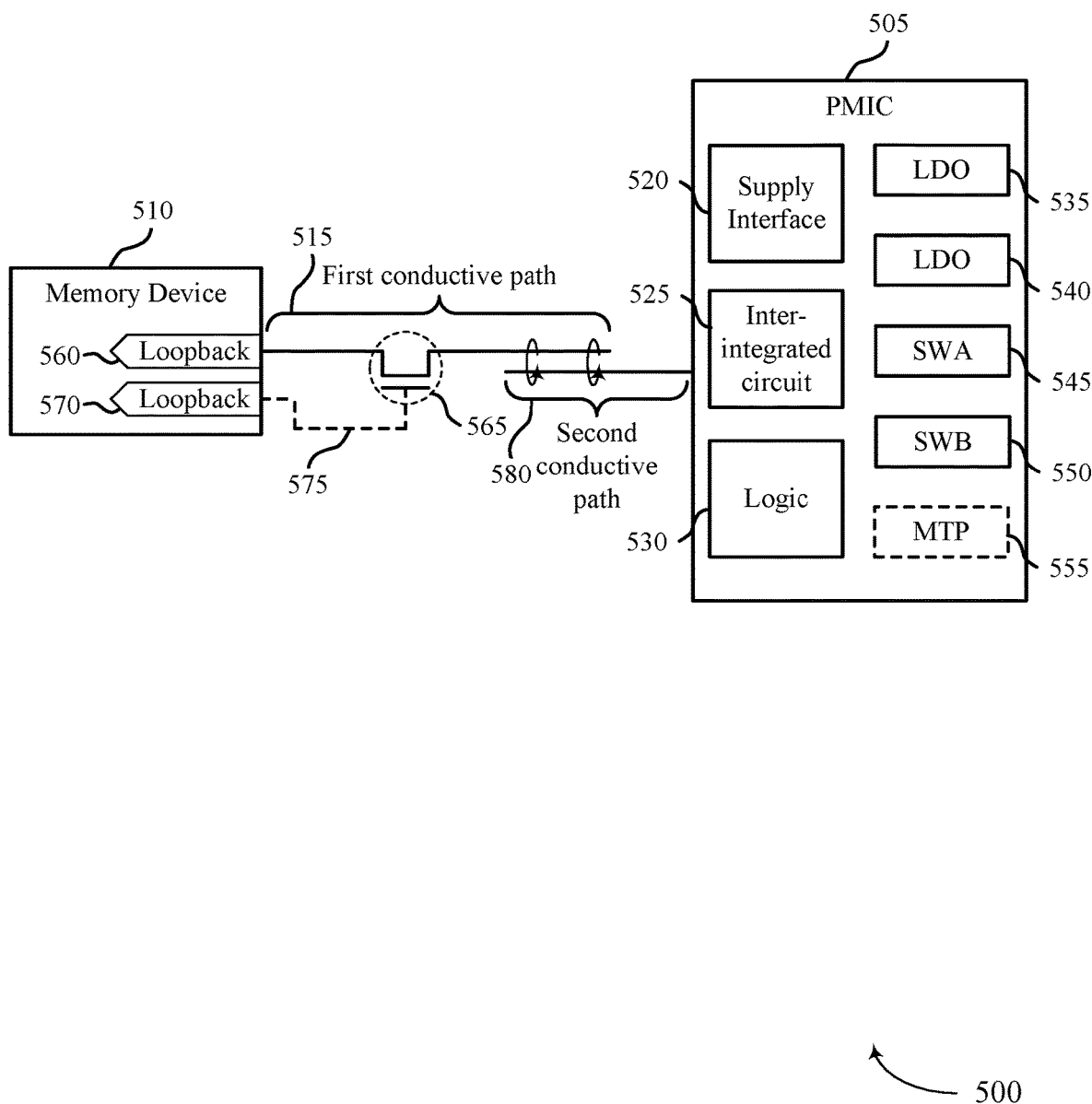
FIG. 5 illustrates an example of a circuit of a memory system that supports techniques for power management using loopback as disclosed herein.

FIG. 5 illustrates an example of a circuit 500 of a memory system that supports techniques for power management using loopback. The circuit 500 may be an example of one or more components of the memory system 300 described with reference to FIG. 3. The circuit 500 may include a PMIC 505, a memory device 510, and a conductive path 515 between the PMIC 505 and the memory device 510. In the example of the circuit 500, PMIC 505 and the memory device 510 may be coupled using a first conductive path 515 that is inductively coupled with a second conductive path 580. The PMIC 505 may be an example of the PMIC 305, 405 described with reference to FIGS. 3 and 4. The memory device 510 may be an example of a memory device 160, 410 or a group of memory devices 310, 315 described with reference to FIGS. 1 through 4.

The PMIC 505 may include a supply interface 520, an inter-integrated circuit 525, logic 530, low-dropout regulators 535, 540, power supplies 545, 550, and, in some cases, multi-time programmable memory 555. The supply interface 520 may be configured to receive a power to be run the PMIC 505 and be distributed to other components of a memory system through the PMIC 505. The inter-integrated circuit 525 may be an example of a bus configured to couple the PMIC 505 with other components. In some cases, the inter-integrated circuit 525 may include a pin configured for receiving information (e.g., a serial clock) from another component. The logic 530 may include an analog-to-digital converter, a digital-to-analog converter, an oscillator, or other components, or any combination thereof. Logic 530 may be for providing feedback to other components in a memory system.

The low-dropout regulators 535, 540 may be for outputting DC power to the memory devices of the memory system, including the memory device 510. In some cases, the low-dropout regulators 535, 540 may be used to regulate an output voltage, when the output voltage is close to a supply voltage input to the PMIC 505. The power supplies 545, 550 may be for outputting power to the memory devices of the memory system, including the memory device 510. In some cases, the power supplies 545, 550 may be examples of switching regulators. The PMIC 505 may include any quantity of low-dropout regulators (e.g., one, two, three, four, five, six, seven, eight), or may include any quantity of power supplies (e.g., one, two, three, four, five, six, seven, eight), or any quantity of both.

The multi-time programmable memory 555, which may optionally be included in a PMIC 505, may be any type of memory used by the PMIC 505 for performing the functions described herein. In some cases, the multi-time programmable memory 555 may be an example of an electrically erasable programmable read-only memory (EEPROM) or other type of memory technology. The multi-time programmable memory 555 may be for protecting circuits, improving a reliability of a power-on sequence or a power-off sequence, setting of output voltage(s), setting of output pull-down resistance(s), or other functions.

The memory device 510 may include at least one loopback pin 560. The first conductive path 515 may directly couple with the loopback pin 560 of the memory device 510. The second conductive path 580 may directly couple with a pin of the PMIC 505 (e.g., a serial clock pin of the inter-integrated circuit 525 of the PMIC 505). The first conductive path 515 may be inductively coupled with the second conductive path 580. To establish the inductive coupling, the first conductive path 515 may be routed to extend parallel to the second conductive path 580 for a length of the conductive paths. To send an activation signal to the PMIC 505, the memory device 510 may send a signal over the first conductive path 515, which may induce a signal on the second conductive path 580, which may be received by the PMIC 505. In some cases, the first conductive path 515 may be coupled with a clock pin of the memory device 510. In some cases, the conductive path 515 may be coupled with a clock pin of the edge connector.

In some examples, the first conductive path 515 and the second conductive path 580 may form a conductive path between the memory device 510 and the PMIC 505. The first conductive path 515 may be inductively coupled with the second conductive path 580 such that signals transmitted over the first conductive path 515 may induce signals on the second conductive path 580 and vice-versa. In such examples, a first signal transmitted by the loopback pin 560 over the first conductive path 515 may induce a second signal over the second conductive path 580 that is received by the PMIC 505.

In other examples, the conductive path 515 may be a gated conductive path that includes a transistor 565 controlled by a second loopback pin 570 of the memory device 510. In such examples, the transistor 565 may be positioned along the conductive path 515 between a first portion of the first conductive path 515 coupled with the memory device 510 and a second portion of the first conductive path 515 that may be inductively coupled with the second conductive path 580. A third conductive path 575 may couple the second loopback pin 570 with a gate of the transistor 565. The memory device 510 may be configured to send the activation signal over the first conductive path 515 and induce a second signal on the second conductive path 580 based on the transmitting the signal using the first loopback pin 560 and activating the transistor 565 using the second loopback pin 570.

In some cases, the memory device 510 may transmit the activation signal using any pin of the memory device 510. In such cases, the loopback pin 560 is an example of a pin that the memory device 510 may use and should not be considered limiting. In some cases, the memory device 510 may transmit the gate signal to the transistor 565 using any one or more pins of the memory device. In such cases, the second loopback pin 570 may be an example of a pin that the memory device 510 may use and should not be considered limiting.

Figure 6:
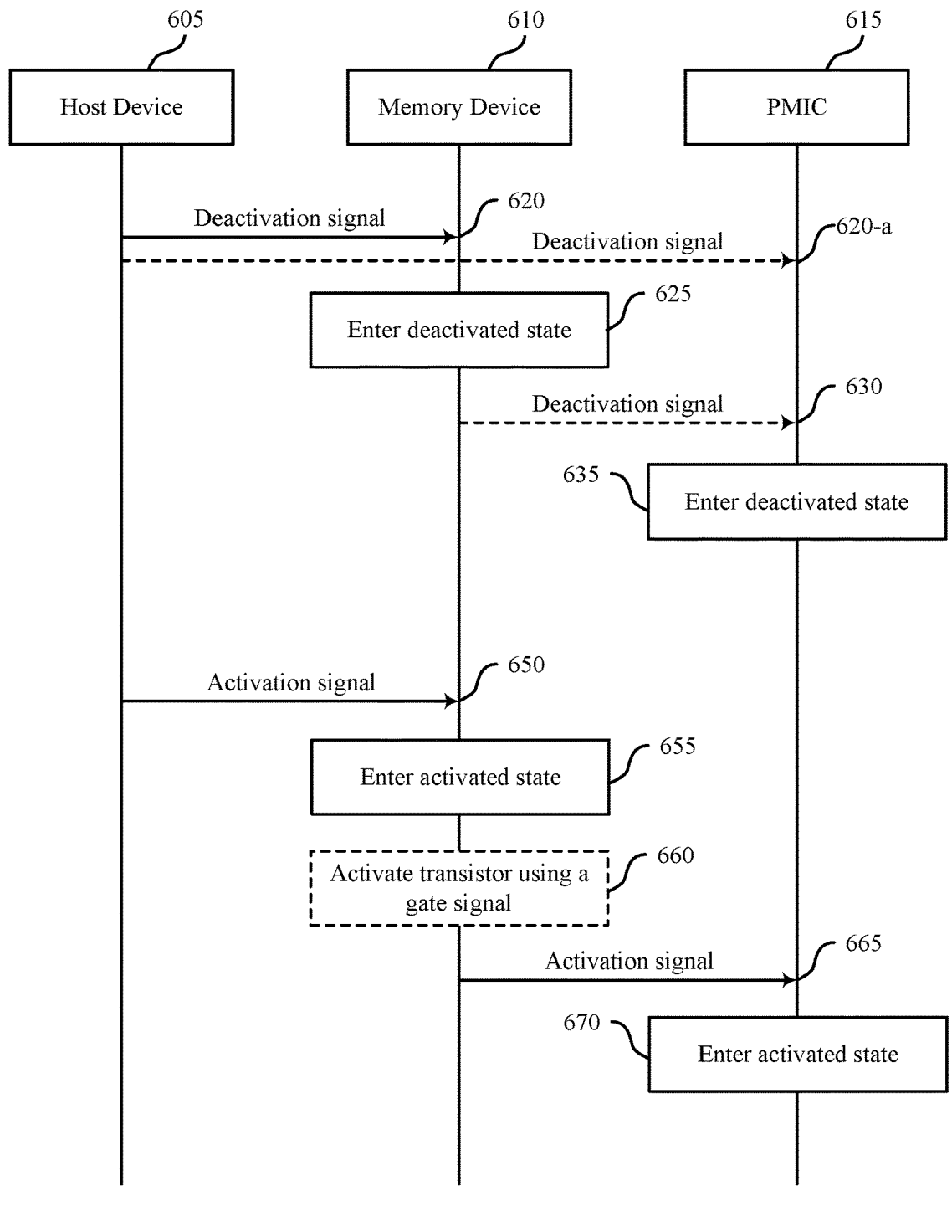
FIG. 6 illustrates an example of a flow diagram that supports techniques for power management using loopback as disclosed herein.

FIG. 6 illustrates an example of a flow diagram 600 that supports techniques for power management using loopback. The flow diagram 600 illustrates techniques that a host device 605, a memory device 610, or a PMIC 615, or any combination thereof may use to exchange deactivation signals and activation signals. In some cases, the memory device 610 may be configured to send an activation signal to the PMIC 615 using at least one loopback pin of the memory device 610. The memory device 510 may be an example of a memory device 160, 410, 510 or a group of memory devices 310, 315 described with reference to FIGS. 1 through 5. The PMIC 615 may be an example of the PMIC 305, 405, 505 described with reference to FIGS. 3 through 5.

The flow diagram 600 is broken into two sections for illustrative and descriptive purposes including: a first section describing procedures, operations, and messages used to communicate deactivation signals and deactivating one or more components (e.g., 620-635); and a second section describing procedures, operations, and messages used to communicate activation signals and activating one or more components (e.g., 650-670).

The host device 605 may determine that one or more memory devices or one or more groups of memory devices of a memory system are to enter a different state, such as a deactivated state (e.g., an S3 state). The host device 605 may transmit a deactivation signal 620 to the memory device 610. The deactivation signal 620 may indicate that the memory device 610 is to transition from a first state to a second states (e.g., an activated state to a deactivated state). The deactivation signal 620 may, in some examples, pass through an edge connector of the memory device 610.

At block 625, in response to receiving the deactivation signal 620, the memory device 610 may enter a deactivated state. Entering a deactivated state may include deactivating one or more components of the memory device 610.

The memory device 610 may transmit a deactivation signal 630 to the PMIC 615 to cause the PMIC 615 to transition from an active state to a deactivated state. the deactivation signal 630 may be similar to or different than the deactivation signal 620. Deactivating at least portions of the memory device 610 and the PMIC 615 may enable the memory system to conserve power.

At block 635, the PMIC 615 may enter the deactivated state based on receiving at least one deactivation signal. There are multiple different conditions that may be present for the PMIC 615 to enter a deactivated state.

In some cases, the PMIC 615 may enter the deactivated state based on receiving the deactivation signal 630 from the memory device 610. In such cases, the memory system may include a single group of memory devices coupled with the host device 605 using a single data channel.

In some cases, the PMIC 615 may enter the deactivated state based on receiving a deactivation signal 620-a from the host device 605. In such cases, a sideband channel may couple the PMIC 615 with the host device 605. The deactivation signal 620-a may be similar to the deactivation signal 620 except it may be received by the PMIC 615 rather than the memory device 610. In such cases, the memory device 610 may optionally not send the deactivation signal 630.

In some cases, the PMIC 615 may enter the deactivated state based on receiving a deactivation signal 630 from each group of memory devices in a memory system. When a memory system includes multiple groups of memory devices, the PMIC 615 may be configured to manage power operations of at least some if not each group of memory devices. Even when one group of memory devices enters a deactivated state, the PMIC 615 may still manage operations for a second group of memory devices that is still in an activated state. In such cases, the PMIC 615 may enter the deactivated state based on receiving signals indicating that all of the groups of memory devices serviced by the PMIC 615 are also in a deactivated state or are transitioning to a deactivated state.

In some examples, each group of memory devices may be configured to send one or more separate deactivation signals 630 to the PMIC 615. In some examples, the groups of memory devices may communicate deactivation signals 630 to each other and the PMIC 615 may receive a single deactivation signal indicating that all of the groups may be in or may be entering a deactivated state. In such examples, a first loopback pin of a first memory device of a first group may be coupled with a second loopback pin of a second memory device of a second group. The first loopback pin may communicate a deactivation signal between the first group and the second group. The second memory device of the second group may also include a third loopback pin that is coupled with the PMIC 615. The third loopback pin may communicate a deactivation signal 630 to the PMIC 615 that indicates that the first group and the second group of memory devices may be in or may be entering a deactivated state. The PMIC 615 may enter the deactivated state based on receiving the third signal.

The host device 605 may determine that one or more memory devices or one or more groups of memory devices of a memory system are to transition from a deactivated state to an activated state. The host device 605 may transmit an activation signal 650 to the memory device 610. The activation signal 650 may indicate that the memory device 610 is to transition from the deactivated state to the activated state. The activation signal 650 may pass through an edge connector of the memory device 610.

In some cases, when the PMIC 615 is in a deactivated state, the PMIC 615 and/or other components of a memory system may not be able to receive certain signals. This may be due to certain components being in a state (e.g., being powered down). Techniques are provided herein for communicating an activation signal to the PMIC 615 in such a way to overcome other signaling difficulties. For example, the memory device 610 may use a loopback pin to drive a signal sent to the PMIC 615 and configured to cause the PMIC 615 to transition from a first state to a second state (e.g., from the deactivated state to the activated state). The communication path between the memory device 610 and the PMIC 615 may be coupled with a clock pin of the PMIC 615.

At block 655, in response to receiving the activation signal 650, the memory device 610 may enter an activated state. Entering the activated state may include activating one or more components of the memory device 610.

The memory device 610 may transmit an activation signal 665 to the PMIC 615 to cause the PMIC 615 to transition from the deactivated state to the activated state. the activation signal 665 may be similar to the activation signal 650. Activating at least portions of the memory device 610 and the PMIC 615 may enable the memory system to be at full functionality. The activation signal 665 may be sent from the memory device 610 to the PMIC 615 using one or more different methods.

In some cases, the memory device 610 may be directly coupled with the PMIC 615 using a conductive path, as described in more detail with reference to FIG. 4. In such cases, the memory device 610 may drive a signal (e.g., the activation signal 665) over the conductive path using a loopback pin (or other pin) and the PMIC 615 may receive that signal (e.g., the activation signal 665) using the conductive line.

In some cases, the memory device 610 may be directly coupled with the PMIC 615 using a gated conductive path, as described in more detail with reference to FIG. 4. In such cases, the memory device 610 may drive a first signal (e.g., the activation signal 665) over a first conductive line using a loopback pin (or other pin). The memory device 610 may also drive a second signal using as second loopback pin (or other pin) over a second conductive line to a transistor that is positioned on the first conductive path. The transistor may be configured to selectively couple the memory device 610 with the PMIC 615 based on receiving the second signal. For example, upon receiving the second signal, the transistor may be activated and thereby establish a communicative link between the memory device and the PMIC 615, as shown at block 660. The PMIC 615 may receive the first signal using the conductive line based at least in part on memory device 610 sending the first signal over the first conductive line and activating the transistor using the second conductive line.

In some cases, the memory device 610 may be inductively coupled with the PMIC 615 using a first conductive path and a second conductive path, as described in more detail with reference to FIG. 5. In such cases, the memory device 610 may drive a first signal (e.g., the activation signal 665 sent by the memory device) over the first conductive path using a loopback pin (or other pin). The first signal may induce a second signal (e.g., the activation signal 665 received by the PMIC 615) on the second conductive path based on inductive coupling between the two paths. The PMIC 615 may receive the second signal induced on the second conductive line. In some examples, the memory device 610 may modify the first signal to improve the inductive coupling and thereby improve the strength of the second signal induced on the second conductive path. In some examples, the memory device 610 may toggle the first signal between at least two different voltage levels to modify the first signal and induce the second signal on the second conductive path.

In some cases, the memory device 610 may be inductively coupled with the PMIC 615 using a first gated conductive path and a second conductive path, as described in more detail with reference to FIG. 5. In such cases, the memory device 610 may drive a first signal (e.g., the activation signal 665 sent by the memory device 610) over a first conductive line using a loopback pin (or other pin). The memory device 610 may also drive a second signal using as second loopback pin (or other pin) over a third conductive line to a transistor that is positioned on the first conductive path. The transistor may be configured to selectively couple a first portion of the first conductive path coupled with the memory device 610 with a second portion of the first conductive path inductively coupled with the second conductive path based on receiving the second signal. For example, upon receiving the second signal, the transistor may be activated and thereby establish a communicative link portions of the first conductive path, as shown at block 660.

The first signal sent over the first conductive path may induce a third signal (e.g., the activation signal 665 received by the PMIC 615) on the second conductive path. The PMIC 615 may receive the third signal using the second conductive path based at least in part on memory device 610 sending the first signal over the first conductive line and activating the transistor using the third conductive line. In some examples, the memory device 610 may modify the first signal to improve the inductive coupling and thereby improve the strength of the third signal induced on the second conductive path. In some examples, the memory device 610 may toggle the first signal between at least two different voltage levels to modify the first signal and induce the third signal on the second conductive path.

At block 670, the PMIC 615 may enter the activated state based on receiving at least one activation signal 665. To enter the activated state, the PMIC 615 may activate one or more components that are currently deactivated. In some cases, the PMIC 615 may transition from a deactivated state to an activated state based on receiving from any one of the groups of memory devices that are serviced by the PMIC 615.

Figure 7:
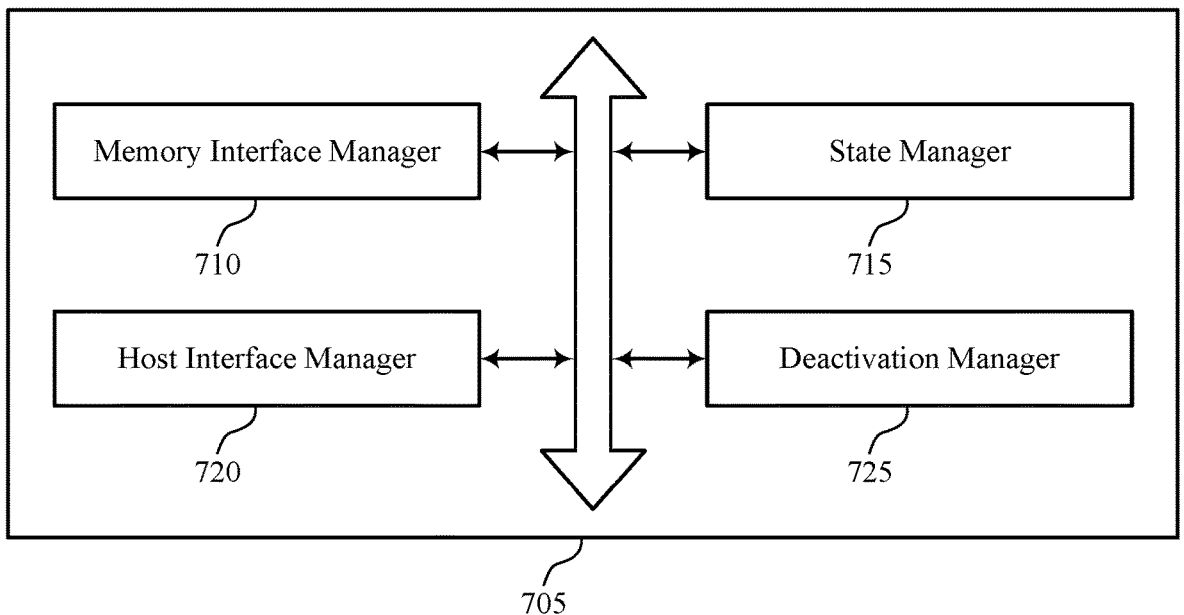
FIG. 7 shows a block diagram of a controller that supports techniques for power management using loopback as disclosed herein.

FIG. 7 shows a block diagram 700 of a controller 705 of a memory device that supports techniques for power management using loopback in accordance with aspects of the present disclosure. The controller 705 may be an example of aspects of the controllers 155, 165, 260, described herein. The controller 705 may include a memory interface manager 710, a state manager 715, a host interface manager 720, and a deactivation manager 725. Each of these modules may communicate, directly or indirectly, with one another (e.g., via one or more buses).

The memory interface manager 710 may receive, at a PMIC, a signal from a memory device of a memory system over a conductive path coupled with a loopback pin of the memory device while one or more components of the PMIC is in a deactivated state. In some examples, the memory interface manager 710 may receive, from the memory device, a second signal to deactivate the one or more components of the PMIC, where receiving the signal is based on receiving the second signal. In some cases, the conductive path is inductively coupled with a second conductive path that is directly coupled with the loopback pin of the memory device. In some cases, the signal is induced by a second signal sent over the second conductive path. In some cases, the signal is received by an inter-integrated circuit of the PMIC.

The state manager 715 may activate the one or more components of the PMIC based on receiving the signal from the memory device over the conductive path. In some examples, the state manager 715 may enter, by the PMIC, the deactivated state based on the memory device entering a deactivated state, where receiving the signal is based on the PMIC being in the deactivated state.

The host interface manager 720 may receive, from a host device via a sideband channel, a second signal to deactivate the one or more components of the PMIC, where receiving the signal from the memory device is based on receiving the second signal from the host device.

The deactivation manager 725 may receive, from the memory device, a second signal to deactivate the one or more components of the PMIC. In some examples, the deactivation manager 725 may receive, from a second memory device, a third signal to deactivate the one or more components of the PMIC. In some examples, the deactivation manager 725 may deactivate the one or more components of the PMIC based on receiving the second signal from the memory device and receiving the third signal from the second memory device.

Figure 8:
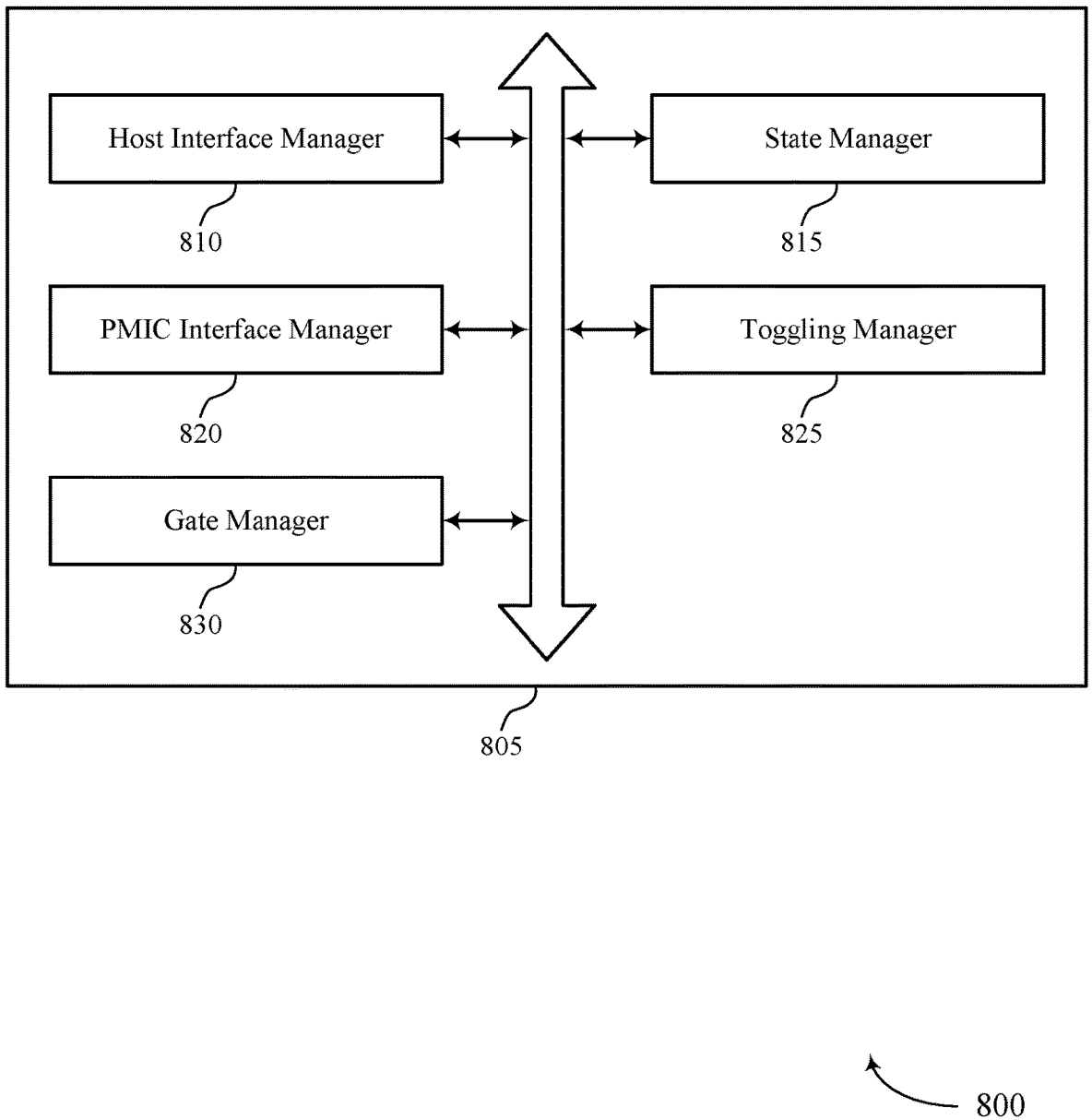
FIG. 8 shows a block diagram of a controller that supports techniques for power management using loopback as disclosed herein.

FIG. 8 shows a block diagram 800 of a controller 805 of a PMIC that supports techniques for power management using loopback in accordance with aspects of the present disclosure. The controller 805 may be an example of aspects of a logic 430 or 530 described herein. The controller 805 may include a host interface manager 810, a state manager 815, a PMIC interface manager 820, a toggling manager 825, and a gate manager 830. Each of these modules may communicate, directly or indirectly, with one another (e.g., via one or more buses).

The host interface manager 810 may receive, at a memory device of a memory system, a first signal from a host device to activate one or more components of the memory device.

The state manager 815 may activate the one or more components of the memory device based on receiving the first signal from the host device. In some examples, the state manager 815 may receive, from the host device, a third signal to deactivate the one or more components of the memory device, where receiving the first signal is based on the receiving the third signal. In some examples, the state manager 815 may send, to the PMIC, a fourth signal to deactivate the one or more components of the PMIC based on receiving the third signal.

The PMIC interface manager 820 may send, to a PMIC over a conductive path coupled with a loopback pin of the memory device, a second signal for activating one or more components of the PMIC based on activating the one or more components of the memory device. In some examples, the PMIC interface manager 820 may induce a third signal on a second conductive path coupled with the PMIC based on sending the second signal using the conductive path, the third signal for activating the one or more components of the PMIC. In some examples, the PMIC interface manager 820 may send the second signal to the PMIC occurs while the PMIC is in a deactivated state.

The toggling manager 825 may toggle the second signal sent over the conductive path between different voltage levels, where inducing the third signal on the second conductive path is based on toggling the second signal.

The gate manager 830 may send, a third signal from the memory device to a gate of a transistor over a second conductive path, the transistor to selectively couple the memory device with the PMIC based on the third signal. In some examples, the gate manager 830 may couple, using the transistor, a first portion of the conductive path with a second portion of the conductive path based on sending the third signal to the transistor. In some cases, the second conductive path couples a second loopback pin of the memory device and the gate of the transistor.

Figure 9:
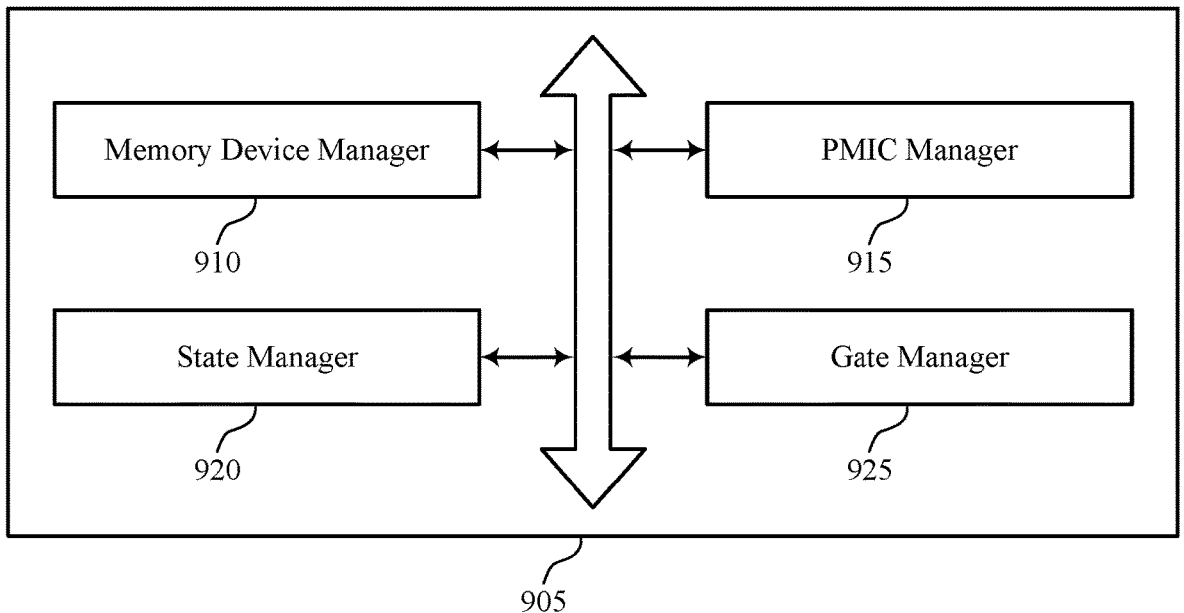
FIG. 9 shows a block diagram of a controller that supports techniques for power management using loopback as disclosed herein.

FIG. 9 shows a block diagram 900 of a controller 905 of a memory system (e.g., a DIMM) that supports techniques for power management using loopback in accordance with aspects of the present disclosure. The controller 905 may be an example of aspects of a controller 105, 155, 165, 260 and/or logic 430, 530 described herein. The controller 905 may include a memory device manager 910, a PMIC manager 915, a state manager 920, and a gate manager 925. Each of these modules may communicate, directly or indirectly, with one another (e.g., via one or more buses).

The memory device manager 910 may send a wake-up signal from a memory device of a memory system to a PMIC of the memory system over a conductive path that couples a loopback pin of the memory device and the PMIC. In some examples, the memory device manager 910 may send a first signal from a memory device of a memory system to a PMIC of the memory system over a first conductive path.

In some examples, the memory device manager 910 may induce a second signal on a second conductive path coupled with the PMIC based on sending the first signal using the first conductive path. In some examples, the memory device manager 910 may modify a level of the wake-up signal sent over the conductive path, where activating the component of the PMIC is based on modifying the level the wake-up signal.

In some examples, the memory device manager 910 may toggle the first signal sent over the first conductive path between different voltage levels, where inducing the second signal on the second conductive path is based on toggling the first signal. In some cases, the second conductive path is inductively coupled with the first conductive path and the second signal is configured to wake-up the PMIC.

The PMIC manager 915 may receive, at the PMIC, the wake-up signal sent over the conductive path. In some examples, the PMIC manager 915 may receive, by the PMIC, a sleep command from a host device using a sideband channel, where entering the deactivated state is based on receiving the sleep command using the sideband channel.

In some examples, the PMIC manager 915 may receive, by the PMIC, a sleep command from the memory device, where entering the deactivated state is based on receiving the sleep command from the memory device. In some examples, the PMIC manager 915 may receive, by the PMIC, a second sleep command from a second memory device of the memory system, where entering the deactivated state is based on receiving the sleep command from the memory device and receiving the second sleep command from the second memory device.

In some examples, the PMIC manager 915 may receive, by an inter-integrated circuit of the PMIC, the second signal induced on the second conductive path, where activating the component of the PMIC is based on receiving the second signal. In some examples, the PMIC manager 915 may receive, by the PMIC, a sleep command from a host device over a sideband channel, where entering the deactivated state is based on receiving the sleep command over the sideband channel.

In some examples, the PMIC manager 915 may receive, by the PMIC, a sleep command from the memory device associated with a first channel of the memory system, where entering the deactivated state is based on receiving the sleep command from the memory device. In some examples, the PMIC manager 915 may receive, by the PMIC, a second sleep command from a second memory device associated with a second channel of the memory system, where entering the deactivated state is based on receiving the sleep command from the memory device associated with the first channel and receiving the second sleep command from the second memory device associated with the second channel.

The state manager 920 may activate a component of the PMIC based on receiving the wake-up signal over the conductive path. In some examples, the state manager 920 may activate a component of the PMIC based on inducing the second signal on the second conductive path. In some examples, the state manager 920 may enter, by the PMIC, a deactivated state based on the memory device entering a deactivated state, where sending the wake-up signal from the memory device is based on the PMIC being in the deactivated state. In some examples, the state manager 920 may enter, by the PMIC, a deactivated state, where sending the first signal is based on the PMIC being in the deactivated state.

The gate manager 925 may send, a gate signal from the memory device to a gate of a transistor over a second conductive path, the transistor to selectively couple the memory device with the PMIC based on the gate signal, where receiving the wake-up signal is based on the gate signal. In some examples, the gate manager 925 may send a third signal from the memory device to a gate of a transistor over a third conductive path, the transistor to selectively couple a first portion of the first conductive path with a second portion of the first conductive path based on the third signal, where inducing the second signal is based on sending the third signal. In some cases, the second conductive path couples a second loopback pin of the memory device and the gate of the transistor. In some cases, the first conductive path is coupled with a first loopback pin of the memory device. In some cases, the third conductive path is coupled with a second loopback pin of the memory device and the gate of the transistor.

Figure 10:
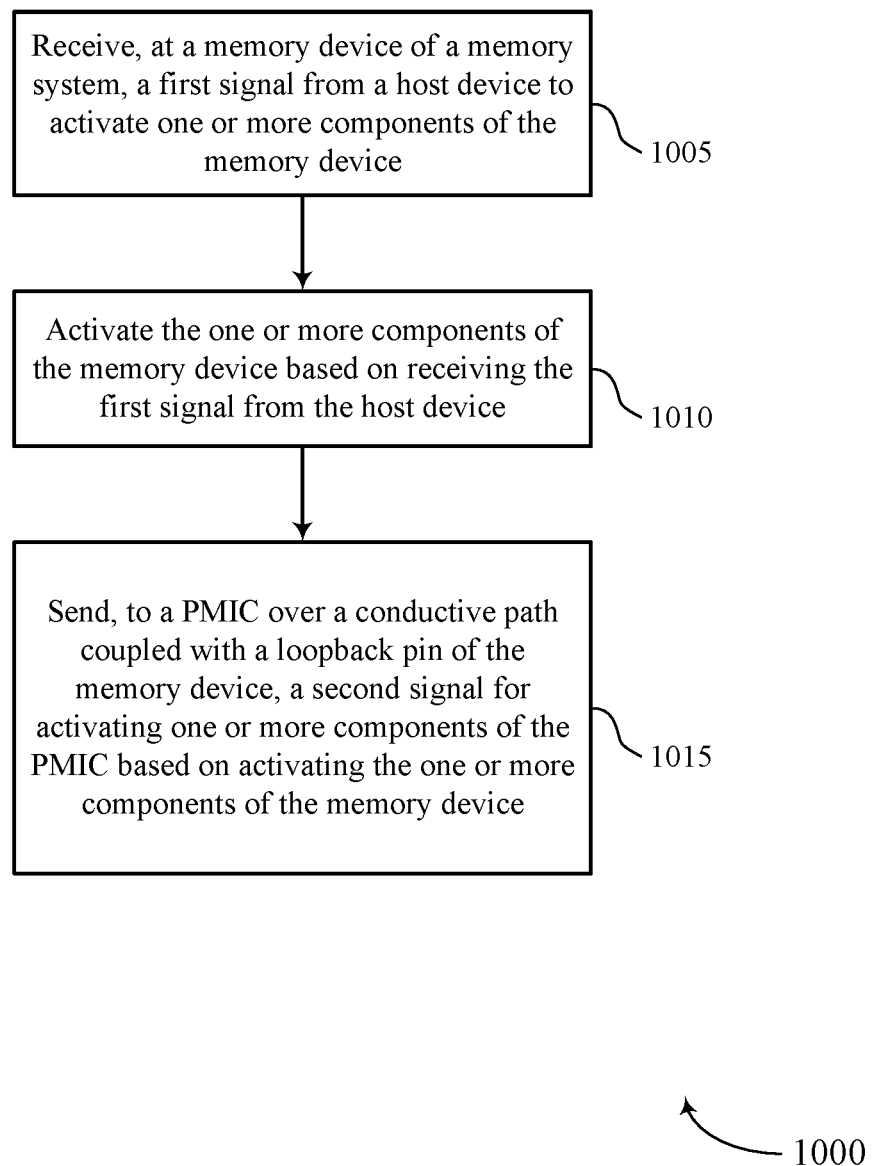
FIGS. 10 through 15 show flowcharts illustrating a method or methods that support techniques for power management using loopback as disclosed herein.

FIG. 10 shows a flowchart illustrating a method 1000 that supports techniques for power management using loopback in accordance with aspects of the present disclosure. The operations of method 1000 may be implemented by a memory device or its components as described herein (e.g., a controller of a memory device). For example, the operations of method 1000 may be performed by a memory device as described with reference to FIGS. 1 through 7. In some examples, a memory device may execute a set of instructions to control the functional elements of the memory device to perform the functions described below. Additionally or alternatively, a memory device may perform aspects of the functions described below using special-purpose hardware.

At 1005, the memory device may receive, at a memory device of a memory system, a first signal from a host device to activate one or more components of the memory device. In some examples, aspects of the operations of 1005 may be performed by a host interface manager as described with reference to FIG. 7.

At 1010, the memory device may activate the one or more components of the memory device based on receiving the first signal from the host device. In some examples, aspects of the operations of 1010 may be performed by a state manager as described with reference to FIG. 7.

At 1015, the memory device may send, to a PMIC over a conductive path coupled with a loopback pin of the memory device, a second signal for activating one or more components of the PMIC based on activating the one or more components of the memory device. In some examples, aspects of the operations of 1015 may be performed by a PMIC interface manager as described with reference to FIG. 7.

In some examples, an apparatus as described herein may perform a method or methods, such as the method 1000. The apparatus may include features, means, or instructions (e.g., a non-transitory computer-readable medium storing instructions executable by a processor) for receiving, at a memory device of a memory system, a first signal from a host device to activate one or more components of the memory device, activating the one or more components of the memory device based on receiving the first signal from the host device, and sending, to a PMIC over a conductive path coupled with a loopback pin of the memory device, a second signal for activating one or more components of the PMIC based on activating the one or more components of the memory device.

Some examples of the method 1000 and the apparatus described herein may further include operations, features, means, or instructions for inducing a third signal on a second conductive path coupled with the PMIC based on sending the second signal using the conductive path, the third signal for activating the one or more components of the PMIC.

Some examples of the method 1000 and the apparatus described herein may further include operations, features, means, or instructions for toggling the second signal sent over the conductive path between different voltage levels, where inducing the third signal on the second conductive path may be based on toggling the second signal.

Some examples of the method 1000 and the apparatus described herein may further include operations, features, means, or instructions for sending, a third signal from the memory device to a gate of a transistor over a second conductive path, the transistor to selectively couple the memory device with the PMIC based on the third signal.

In some examples of the method 1000 and the apparatus described herein, the second conductive path couples a second loopback pin of the memory device and the gate of the transistor.

Some examples of the method 1000 and the apparatus described herein may further include operations, features, means, or instructions for coupling, using the transistor, a first portion of the conductive path with a second portion of the conductive path based on sending the third signal to the transistor.

Some examples of the method 1000 and the apparatus described herein may further include operations, features, means, or instructions for receiving, from the host device, a third signal to deactivate the one or more components of the memory device, where receiving the first signal may be based on the receiving the third signal.

Some examples of the method 1000 and the apparatus described herein may further include operations, features, means, or instructions for sending, to the PMIC, a fourth signal to deactivate the one or more components of the PMIC based on receiving the third signal.

Some examples of the method 1000 and the apparatus described herein may further include operations, features, means, or instructions for sending the second signal to the PMIC occurs while the PMIC may be in a deactivated state.

Figure 11:
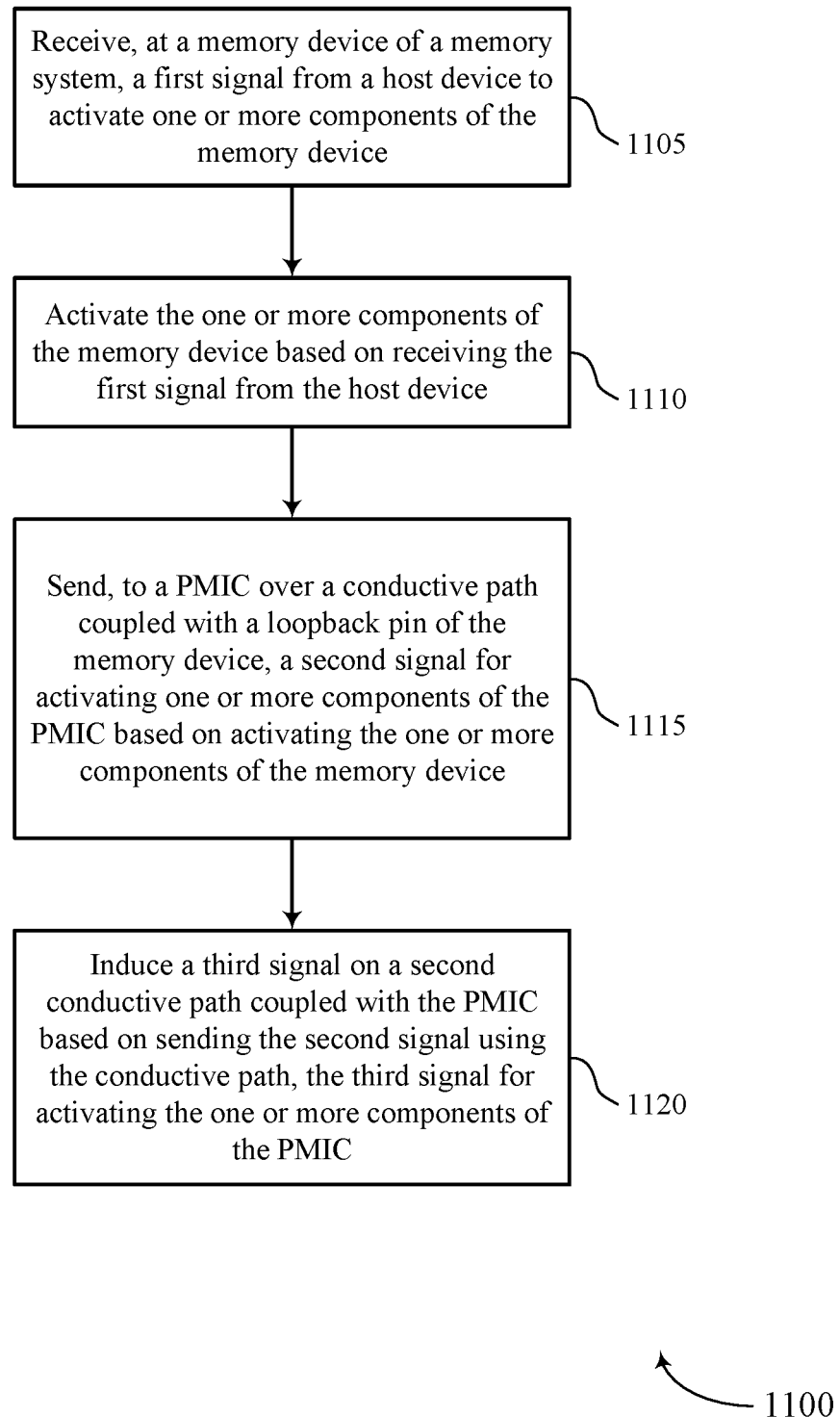

FIG. 11 shows a flowchart illustrating a method 1100 that supports techniques for power management using loopback in accordance with aspects of the present disclosure. The operations of method 1100 may be implemented by a memory device or its components as described herein (e.g., a controller of a memory device). For example, the operations of method 1100 may be performed by a memory device as described with reference to FIGS. 1 through 7. In some examples, a memory device may execute a set of instructions to control the functional elements of the memory device to perform the functions described below. Additionally or alternatively, a memory device may perform aspects of the functions described below using special-purpose hardware.

At 1105, the memory device may receive, at a memory device of a memory system, a first signal from a host device to activate one or more components of the memory device. The operations of 1105 may be performed according to the methods described herein. In some examples, aspects of the operations of 1105 may be performed by a host interface manager as described with reference to FIG. 7.

At 1110, the memory device may activate the one or more components of the memory device based on receiving the first signal from the host device. The operations of 1110 may be performed according to the methods described herein. In some examples, aspects of the operations of 1110 may be performed by a state manager as described with reference to FIG. 7.

At 1115, the memory device may send, to a PMIC over a conductive path coupled with a loopback pin of the memory device, a second signal for activating one or more components of the PMIC based on activating the one or more components of the memory device. The operations of 1115 may be performed according to the methods described herein. In some examples, aspects of the operations of 1115 may be performed by a PMIC interface manager as described with reference to FIG. 7.

At 1120, the memory device may induce a third signal on a second conductive path coupled with the PMIC based on sending the second signal using the conductive path, the third signal for activating the one or more components of the PMIC. The operations of 1120 may be performed according to the methods described herein. In some examples, aspects of the operations of 1120 may be performed by a PMIC interface manager as described with reference to FIG. 7.

Figure 12:
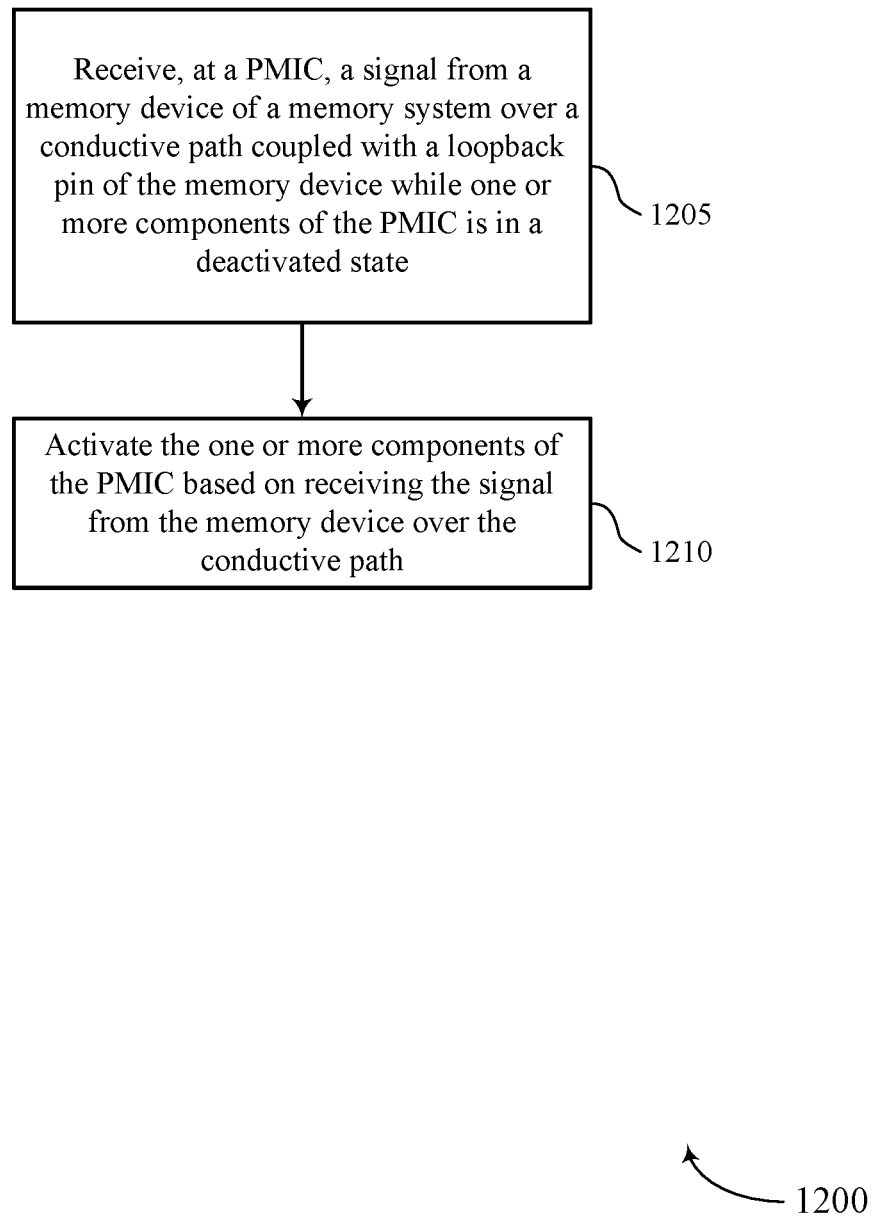

FIG. 12 shows a flowchart illustrating a method 1200 that supports techniques for power management using loopback in accordance with aspects of the present disclosure. The operations of method 1200 may be implemented by a PMIC or its components as described herein (e.g., logic of a PMIC). For example, the operations of method 1200 may be performed by a PMIC as described with reference to FIGS. 3 through 6 and 8. In some examples, a PMIC may execute a set of instructions to control the functional elements of the PMIC to perform the functions described below. Additionally or alternatively, a PMIC may perform aspects of the functions described below using special-purpose hardware.

At 1205, the PMIC may receive, at a PMIC, a signal from a memory device of a memory system over a conductive path coupled with a loopback pin of the memory device while one or more components of the PMIC is in a deactivated state. In some examples, aspects of the operations of 1205 may be performed by a memory interface manager as described with reference to FIG. 8.

At 1210, the PMIC may activate the one or more components of the PMIC based on receiving the signal from the memory device over the conductive path. In some examples, aspects of the operations of 1210 may be performed by a state manager as described with reference to FIG. 8.

In some examples, an apparatus as described herein may perform a method or methods, such as the method 1200. The apparatus may include features, means, or instructions (e.g., a non-transitory computer-readable medium storing instructions executable by a processor) for receiving, at a PMIC, a signal from a memory device of a memory system over a conductive path coupled with a loopback pin of the memory device while one or more components of the PMIC is in a deactivated state and activating the one or more components of the PMIC based on receiving the signal from the memory device over the conductive path.

Some examples of the method 1200 and the apparatus described herein may further include operations, features, means, or instructions for receiving, from a host device via a sideband channel, a second signal to deactivate the one or more components of the PMIC, where receiving the signal from the memory device may be based on receiving the second signal from the host device.

Some examples of the method 1200 and the apparatus described herein may further include operations, features, means, or instructions for receiving, from the memory device, a second signal to deactivate the one or more components of the PMIC, where receiving the signal may be based on receiving the second signal.

Some examples of the method 1200 and the apparatus described herein may further include operations, features, means, or instructions for entering, by the PMIC, the deactivated state based on the memory device entering a deactivated state, where receiving the signal may be based on the PMIC being in the deactivated state.

Some examples of the method 1200 and the apparatus described herein may further include operations, features, means, or instructions for receiving, from the memory device, a second signal to deactivate the one or more components of the PMIC, receiving, from a second memory device, a third signal to deactivate the one or more components of the PMIC and deactivating the one or more components of the PMIC based on receiving the second signal from the memory device and receiving the third signal from the second memory device.

In some examples of the method 1200 and the apparatus described herein, the conductive path may be inductively coupled with a second conductive path that may be directly coupled with the loopback pin of the memory device and the signal may be induced by a second signal sent over the second conductive path.

In some examples of the method 1200 and the apparatus described herein, the signal may be received by an inter-integrated circuit of the PMIC.

Figure 13:
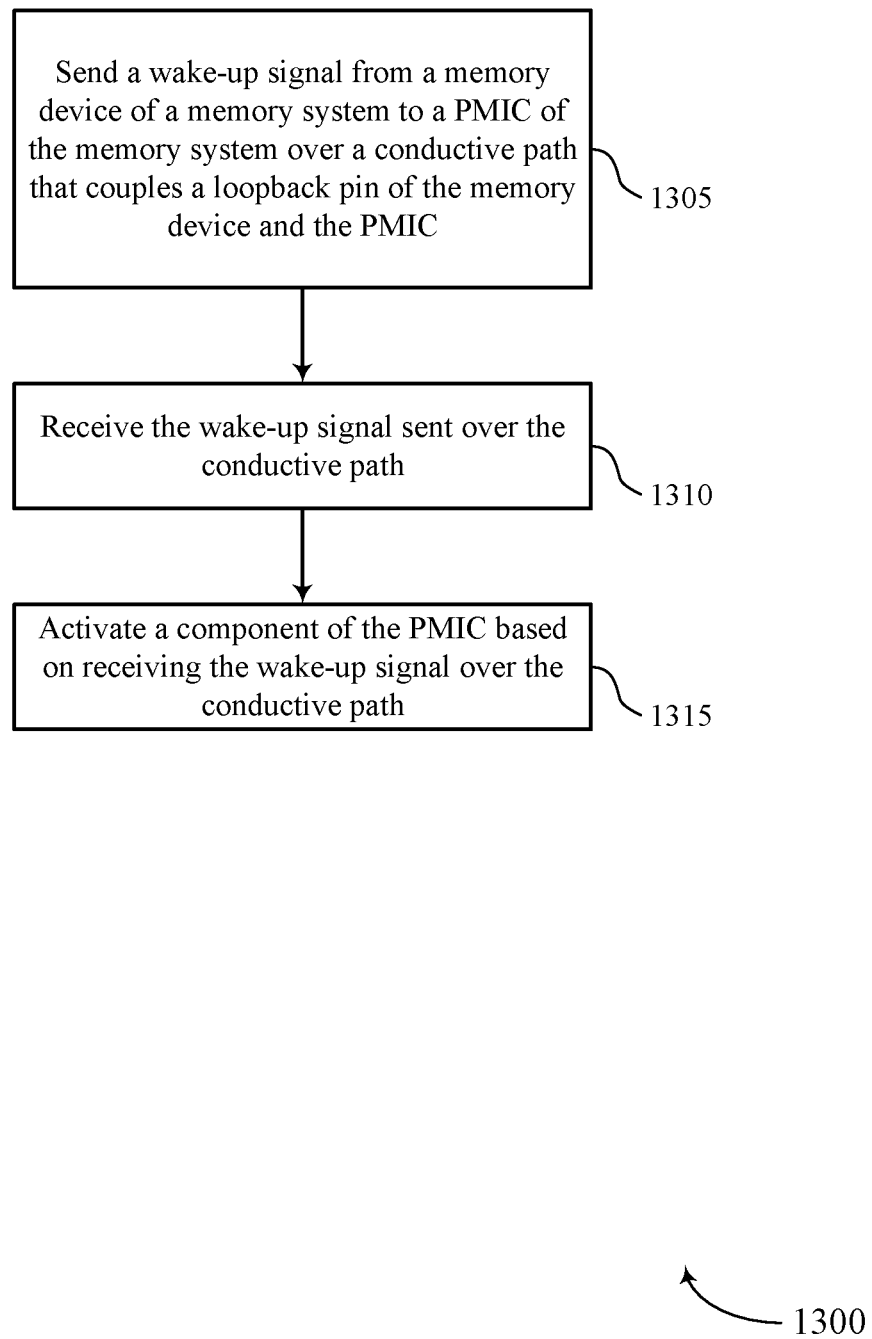

FIG. 13 shows a flowchart illustrating a method 1300 that supports techniques for power management using loopback in accordance with aspects of the present disclosure. The operations of method 1300 may be implemented by a memory system or its components as described herein (e.g., a memory device, a PMIC, or a controller or logic thereof). For example, the operations of method 1300 may be performed by a memory system, a memory device, a PMIC, or a combination thereof as described with reference to FIGS. 3 through 9. In some examples, a memory system may execute a set of instructions to control the functional elements of the memory system to perform the functions described below. Additionally or alternatively, a memory system may perform aspects of the functions described below using special-purpose hardware.

At 1305, the memory system may send a wake-up signal from a memory device of a memory system to a PMIC of the memory system over a conductive path that couples a loopback pin of the memory device and the PMIC. In some examples, aspects of the operations of 1305 may be performed by a memory device manager as described with reference to FIG. 9.

At 1310, the memory system may receive the wake-up signal sent over the conductive path. In some examples, aspects of the operations of 1310 may be performed by a PMIC manager as described with reference to FIG. 9.

At 1315, the memory system may activate a component of the PMIC based on receiving the wake-up signal over the conductive path. In some examples, aspects of the operations of 1315 may be performed by a state manager as described with reference to FIG. 9.

In some examples, an apparatus as described herein may perform a method or methods, such as the method 1300. The apparatus may include features, means, or instructions (e.g., a non-transitory computer-readable medium storing instructions executable by a processor) for sending a wake-up signal from a memory device of a memory system to a PMIC of the memory system over a conductive path that couples a loopback pin of the memory device and the PMIC, receiving, at the PMIC, the wake-up signal sent over the conductive path, and activating a component of the PMIC based on receiving the wake-up signal over the conductive path.

Some examples of the method 1300 and the apparatus described herein may further include operations, features, means, or instructions for modifying a level of the wake-up signal sent over the conductive path, where activating the component of the PMIC may be based on modifying the level the wake-up signal.

Some examples of the method 1300 and the apparatus described herein may further include operations, features, means, or instructions for sending, a gate signal from the memory device to a gate of a transistor over a second conductive path, the transistor to selectively couple the memory device with the PMIC based on the gate signal, where receiving the wake-up signal may be based on the gate signal.

In some examples of the method 1300 and the apparatus described herein, the second conductive path couples a second loopback pin of the memory device and the gate of the transistor.

Some examples of the method 1300 and the apparatus described herein may further include operations, features, means, or instructions for entering, by the PMIC, a deactivated state based on the memory device entering a deactivated state, where sending the wake-up signal from the memory device may be based on the PMIC being in the deactivated state.

Some examples of the method 1300 and the apparatus described herein may further include operations, features, means, or instructions for receiving, by the PMIC, a sleep command from a host device using a sideband channel, where entering the deactivated state may be based on receiving the sleep command using the sideband channel.

Some examples of the method 1300 and the apparatus described herein may further include operations, features, means, or instructions for receiving, by the PMIC, a sleep command from the memory device, where entering the deactivated state may be based on receiving the sleep command from the memory device.

Some examples of the method 1300 and the apparatus described herein may further include operations, features, means, or instructions for receiving, by the PMIC, a second sleep command from a second memory device of the memory system, where entering the deactivated state may be based on receiving the sleep command from the memory device and receiving the second sleep command from the second memory device.

Figure 14:
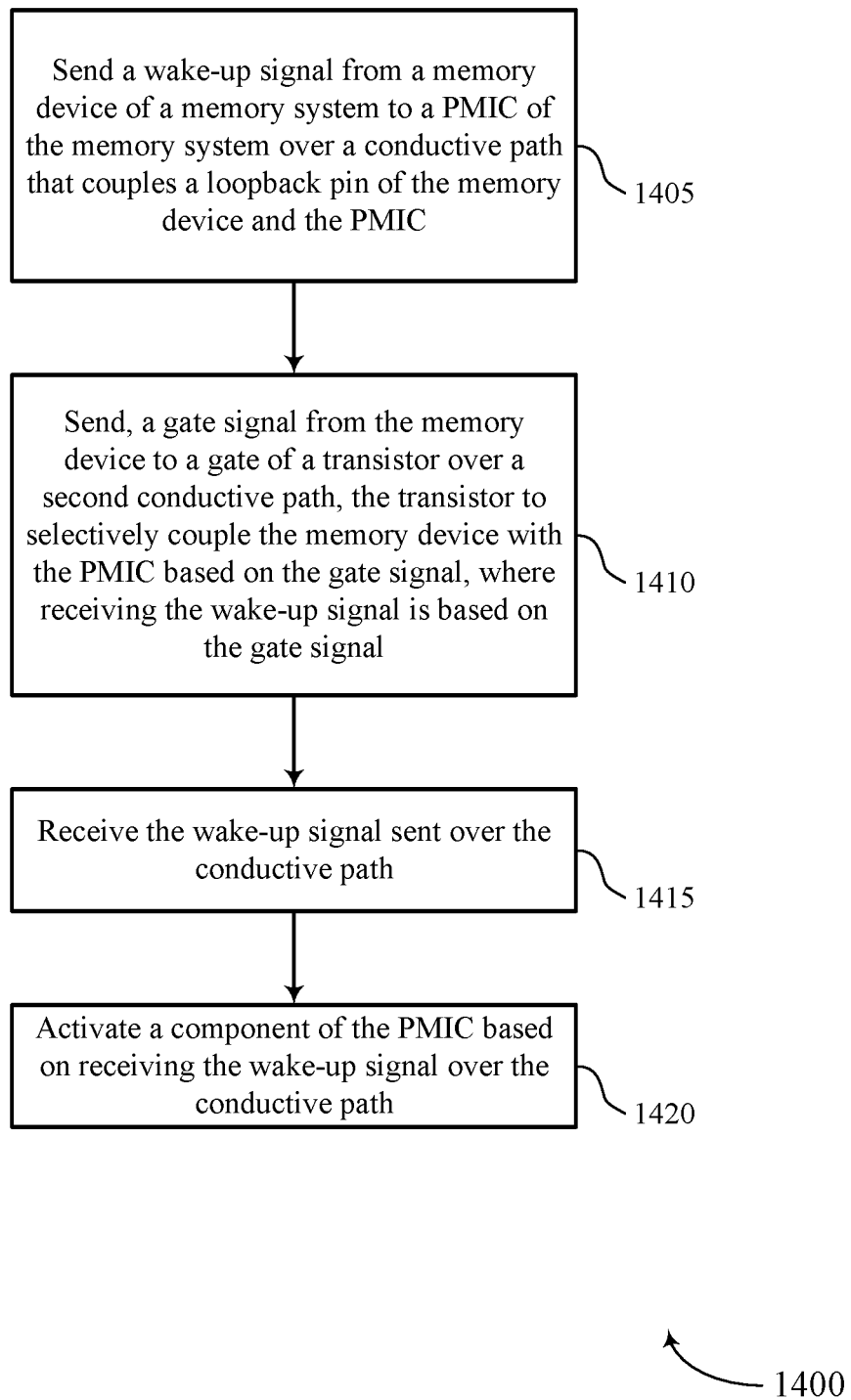

FIG. 14 shows a flowchart illustrating a method 1400 that supports techniques for power management using loopback in accordance with aspects of the present disclosure. The operations of method 1400 may be implemented by a memory system or its components as described herein (e.g., a memory device, a PMIC, or a controller or logic thereof). For example, the operations of method 1400 may be performed by a memory system, a memory device, a PMIC, or a combination thereof as described with reference to FIGS. 3 through 9. In some examples, a memory system may execute a set of instructions to control the functional elements of the memory system to perform the functions described below. Additionally or alternatively, a memory system may perform aspects of the functions described below using special-purpose hardware.

At 1405, the memory system may send a wake-up signal from a memory device of a memory system to a PMIC of the memory system over a conductive path that couples a loopback pin of the memory device and the PMIC. In some examples, aspects of the operations of 1405 may be performed by a memory device manager as described with reference to FIG. 9.

At 1410, the memory system may send, a gate signal from the memory device to a gate of a transistor over a second conductive path, the transistor to selectively couple the memory device with the PMIC based on the gate signal, where receiving the wake-up signal is based on the gate signal. In some examples, aspects of the operations of 1410 may be performed by a gate manager as described with reference to FIG. 9.

At 1415, the memory system may receive the wake-up signal sent over the conductive path. In some examples, aspects of the operations of 1415 may be performed by a PMIC manager as described with reference to FIG. 9.

At 1420, the memory system may activate a component of the PMIC based on receiving the wake-up signal over the conductive path. In some examples, aspects of the operations of 1420 may be performed by a state manager as described with reference to FIG. 9.

Figure 15:
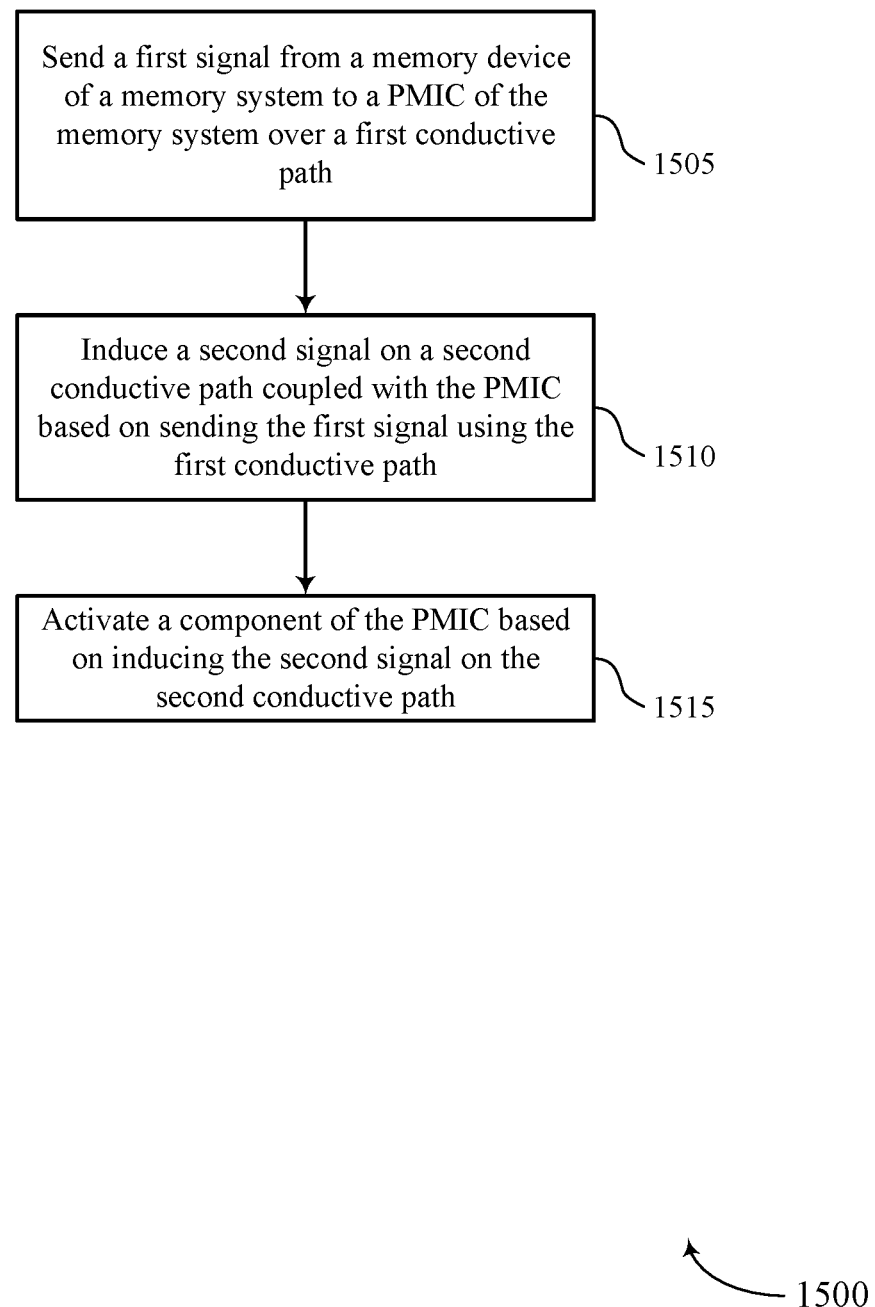

FIG. 15 shows a flowchart illustrating a method 1500 that supports techniques for power management using loopback in accordance with aspects of the present disclosure. The operations of method 1500 may be implemented by a memory system or its components as described herein (e.g., a memory device, a PMIC, or a controller or logic thereof). For example, the operations of method 1500 may be performed by a memory system, a memory device, a PMIC, or a combination thereof as described with reference to FIGS. 3 through 9. In some examples, a memory system may execute a set of instructions to control the functional elements of the memory system to perform the functions described below. Additionally or alternatively, a memory system may perform aspects of the functions described below using special-purpose hardware.

At 1505, the memory system may send a first signal from a memory device of a memory system to a PMIC of the memory system over a first conductive path. In some examples, aspects of the operations of 1505 may be performed by a memory device manager as described with reference to FIG. 9.

At 1510, the memory system may induce a second signal on a second conductive path coupled with the PMIC based on sending the first signal using the first conductive path. In some examples, aspects of the operations of 1510 may be performed by a memory device manager as described with reference to FIG. 9.

At 1515, the memory system may activate a component of the PMIC based on inducing the second signal on the second conductive path. In some examples, aspects of the operations of 1515 may be performed by a state manager as described with reference to FIG. 9.

In some examples, an apparatus as described herein may perform a method or methods, such as the method 1500. The apparatus may include features, means, or instructions (e.g., a non-transitory computer-readable medium storing instructions executable by a processor) for sending a first signal from a memory device of a memory system to a PMIC of the memory system over a first conductive path, inducing a second signal on a second conductive path coupled with the PMIC based on sending the first signal using the first conductive path, and activating a component of the PMIC based on inducing the second signal on the second conductive path.

Some examples of the method 1500 and the apparatus described herein may further include operations, features, means, or instructions for toggling the first signal sent over the first conductive path between different voltage levels, where inducing the second signal on the second conductive path may be based on toggling the first signal.

Some examples of the method 1500 and the apparatus described herein may further include operations, features, means, or instructions for sending a third signal from the memory device to a gate of a transistor over a third conductive path, the transistor to selectively couple a first portion of the first conductive path with a second portion of the first conductive path based on the third signal, where inducing the second signal may be based on sending the third signal.

In some examples of the method 1500 and the apparatus described herein, the first conductive path may be coupled with a first loopback pin of the memory device and the third conductive path may be coupled with a second loopback pin of the memory device and the gate of the transistor.

Some examples of the method 1500 and the apparatus described herein may further include operations, features, means, or instructions for receiving, by an inter-integrated circuit of the PMIC, the second signal induced on the second conductive path, where activating the component of the PMIC may be based on receiving the second signal.

Some examples of the method 1500 and the apparatus described herein may further include operations, features, means, or instructions for entering, by the PMIC, a deactivated state, where sending the first signal may be based on the PMIC being in the deactivated state.

Some examples of the method 1500 and the apparatus described herein may further include operations, features, means, or instructions for receiving, by the PMIC, a sleep command from a host device over a sideband channel, where entering the deactivated state may be based on receiving the sleep command over the sideband channel.

Some examples of the method 1500 and the apparatus described herein may further include operations, features, means, or instructions for receiving, by the PMIC, a sleep command from the memory device associated with a first channel of the memory system, where entering the deactivated state may be based on receiving the sleep command from the memory device.

Some examples of the method 1500 and the apparatus described herein may further include operations, features, means, or instructions for receiving, by the PMIC, a second sleep command from a second memory device associated with a second channel of the memory system, where entering the deactivated state may be based on receiving the sleep command from the memory device associated with the first channel and receiving the second sleep command from the second memory device associated with the second channel.

In some examples of the method 1500 and the apparatus described herein, the second conductive path may be inductively coupled with the first conductive path and the second signal may be configured to wake-up the PMIC.

It should be noted that the methods described herein describe possible implementations, and that the operations and the steps may be rearranged or otherwise modified and that other implementations are possible. Further, aspects from two or more of the methods may be combined.

Information and signals described herein may be represented using any of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

As used herein, the term "virtual ground" refers to a node of an electrical circuit that is held at a voltage of approximately zero volts (0V) but that is not directly coupled with ground. Accordingly, the voltage of a virtual ground may temporarily fluctuate and return to approximately 0V at steady state. A virtual ground may be implemented using various electronic circuit elements, such as a voltage divider consisting of operational amplifiers and resistors. Other implementations are also possible. "Virtual grounding" or "virtually grounded" means connected to approximately 0V.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some cases, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The term "layer" used herein refers to a stratum or sheet of a geometrical structure. each layer may have three dimensions (e.g., height, width, and depth) and may cover at least a portion of a surface. For example, a layer may be a three-dimensional structure where two dimensions are greater than a third, e.g., a thin-film. Layers may include different elements, components, and/or materials. In some cases, one layer may be composed of two or more sublayers. In some of the appended figures, two dimensions of a three-dimensional layer are depicted for purposes of illustration. Those skilled in the art will, however, recognize that the layers are three-dimensional in nature.

The devices discussed herein, including a memory array, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are signals), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method, comprising:
   sending, from a memory device to a power management integrated circuit (PMIC) via a first loopback pin of the memory device, a first signal to activate one or more components of the PMIC, the first signal sent outside a testing phase of operation;
   sending, via a second loopback pin of the memory device outside the testing phase of operation and from the memory device to a transistor coupled with the second loopback pin and configured to selectively couple the memory device with the PMIC, a second signal to activate the transistor outside the testing phase of operation, wherein the first loopback pin and the second loopback pin are each configured to communicate feedback data during the testing phase of operation; and
   inducing, by the first signal via inductive coupling between a first conductive path coupled with the first loopback pin of the memory device and a second conductive path coupled with the PMIC, a third signal on the second conductive path, the third signal for activating the one or more components of the PMIC.

2. The method of claim 1, further comprising:
   toggling the first signal sent via the first loopback pin between different voltage levels, wherein inducing the third signal on the second conductive path is based at least in part on toggling the first signal.

3. The method of claim 1, further comprising:
   coupling, using the transistor, a first portion of the first conductive path with a second portion of the first conductive path based at least in part on sending the second signal to the transistor.

4. The method of claim 1, wherein the first signal is sent via the first conductive path coupled with the first loopback pin.

5. The method of claim 1, further comprising:
   receiving, at a memory system comprising the memory device, a fourth signal from a host device to activate one or more components of the memory device, wherein sending the first signal is based at least in part on receiving the fourth signal.

6. The method of claim 5, further comprising:
   activating the one or more components of the memory device based at least in part on receiving the fourth signal, wherein sending the first signal is further based at least in part on activating the one or more components of the memory device.

7. The method of claim 5, further comprising:
   receiving, from the host device, a fifth signal to deactivate the one or more components of the memory device, wherein receiving the fourth signal is based at least in part on receiving the fifth signal.

8. The method of claim 7, further comprising:
   sending, to the PMIC, a sixth signal to deactivate the one or more components of the PMIC based at least in part on receiving the fifth signal.

9. The method of claim 1, wherein sending the second signal to the PMIC occurs while the PMIC is in a deactivated state.

10. A method, comprising:
    receiving, at a power management integrated circuit (PMIC), a first signal from a memory device of a memory system via a first conductive path coupled with a first loopback pin of the memory device while one or more components of the PMIC is in a deactivated state, the first signal sent outside a testing phase of operation, wherein:
    a transistor, which electrically separates the first loopback pin from the first conductive path, selectively couples the first loopback pin of the memory device with the PMIC based at least in part on receiving a second signal via a second loopback pin of the memory device coupled with a gate of the transistor, wherein the second signal is received outside a testing phase of operation and activates the transistor outside the testing phase of operation, and wherein:
    the first loopback pin and the second loopback pin are each configured to communicate feedback data during the testing phase of operation; and
    activating the one or more components of the PMIC based at least in part on receiving the first signal from the memory device via the first conductive path.

11. The method of claim 10, further comprising:
    receiving, from a host device via a sideband channel, a third signal to deactivate the one or more components of the PMIC, wherein receiving the first signal from the memory device is based at least in part on receiving the third signal from the host device.

12. A system, comprising:
    a memory device comprising memory cells configured to store data;
    a power management integrated circuit (PMIC) configured to perform power control functions for the system and configured to selectively transition between a deactivated state and an activated state;
    a first loopback pin of the memory device and the PMIC, the memory device configured to cause the PMIC to transition from the deactivated state to the activated state by sending a first signal via the first loopback pin outside a testing phase of operation;

a first conductive path coupled with the first loopback pin and configured to induce, via inductive coupling with a second conductive path coupled with the PMIC, a second signal on the second conductive path for transitioning the PMIC to the activated state;

a second loopback pin of the memory device; and a transistor coupled with the second loopback pin and positioned between a first portion of the first conductive path and a second portion of the first conductive path and configured to selectively couple the memory device with the PMIC, wherein the memory device is configured to send, via the second loopback pin, a third signal outside the testing phase of operation to activate the transistor, wherein the third signal activates the transistor outside the testing phase of operation, and wherein the first loopback pin and the second loopback pin are each configured to communicate feedback data during the testing phase of operation.

13. The system of claim 12,
wherein the first signal is sent via the first conductive path.

14. The system of claim 12, further comprising:
a first group of memory devices coupled with a first channel, the first group of memory devices comprising the memory device; and
a second group of memory devices coupled with a second channel, wherein the PMIC is configured to enter the deactivated state based at least in part on the first group of memory devices and the second group of memory devices entering a deactivated state.

* * * * *